(12) United States Patent
Kim et al.

(10) Patent No.: US 7,847,386 B1
(45) Date of Patent: Dec. 7, 2010

(54) REDUCED SIZE STACKED SEMICONDUCTOR PACKAGE AND METHOD OF MAKING THE SAME

(75) Inventors: Bong Chan Kim, Seongnam-si (KR); Jae Young Na, Mapo-gu (KR); Jae Kyu Song, Yongin-si (KR)

(73) Assignee: Amkor Technology, Inc., Chandler, AZ (US)

( * ) Notice: Subject to any disclaimer, the term of this patent is extended or adjusted under 35 U.S.C. 154(b) by 228 days.

(21) Appl. No.: 11/935,314

(22) Filed: Nov. 5, 2007

(51) Int. Cl.
*H01L 23/48* (2006.01)

(52) U.S. Cl. .................. 257/686; 257/723; 257/777; 257/786

(58) Field of Classification Search .................. 257/686, 257/723, 777, E25.023, E21.597, E21.598, 257/21.705; 438/109, 455
See application file for complete search history.

(56) References Cited

U.S. PATENT DOCUMENTS

| | | | |
|---|---|---|---|
| 2,596,993 | A | 5/1952 | Gookin |
| 3,435,815 | A | 4/1969 | Forcier |
| 3,734,660 | A | 5/1973 | Davies et al. |
| 3,838,984 | A | 10/1974 | Crane et al. |
| 4,054,238 | A | 10/1977 | Lloyd et al. |
| 4,189,342 | A | 2/1980 | Kock |
| 4,258,381 | A | 3/1981 | Inaba |
| 4,289,922 | A | 9/1981 | Devlin |
| 4,301,464 | A | 11/1981 | Otsuki et al. |
| 4,332,537 | A | 6/1982 | Slepcevic |

(Continued)

FOREIGN PATENT DOCUMENTS

DE 19734794 A1 8/1997

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner*—Stephen W Smoot
(74) *Attorney, Agent, or Firm*—Stetina Brunda Garred & Brucker

(57) ABSTRACT

In accordance with the present invention, there is provided multiple embodiments of a reduced size stackable semiconductor package. In a basic embodiment of the present invention, the semiconductor package comprises a bulk layer having at least one first bond pad formed therein. At least one active layer is formed on the bulk layer and electrically coupled to the first bond pad. Additionally, at least one second bond pad is formed on the active layer and is electrically coupled thereto. A protection layer is formed on that surface of the active layer having the second bond pad formed thereon, the protection layer also partially encapsulating the second bond pad. In other embodiments of the present invention, the above-described semiconductor package is provided in a stacked arrangement and in a prescribed pattern of electrical communication with one or more additional, identically configured semiconductor packages. In these stacked arrangements, one or more interposers and/or solder balls may optionally integrated into such semiconductor package stacks. In other embodiments of the present invention, a semiconductor package is provided wherein a semiconductor package stack is itself electrically connected to a substrate and covered with an encapsulant material which ultimately hardens into a package body.

20 Claims, 17 Drawing Sheets

U.S. PATENT DOCUMENTS

| | | |
|---|---|---|
| 4,417,266 A | 11/1983 | Grabbe |
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson et al. |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, III et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,285,352 A | 2/1994 | Pastore et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,467,032 A | 11/1995 | Lee |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,637,922 A | 6/1997 | Fillion et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,683,943 A | 11/1997 | Yamada |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,854,512 A | 12/1998 | Manteghi |
| 5,856,911 A | 1/1999 | Riley |
| 5,859,471 A | 1/1999 | Kuraishi et al. |
| 5,861,666 A * | 1/1999 | Bellaar ............... 257/686 |
| 5,866,939 A | 2/1999 | Shin et al. |
| 5,866,942 A | 2/1999 | Suzuki et al. |
| 5,871,782 A | 2/1999 | Choi |

| | | | | | | |
|---|---|---|---|---|---|---|
| 5,874,784 | A | 2/1999 | Aoki et al. | 6,421,013 | B1 | 7/2002 | Chung |
| 5,877,043 | A | 3/1999 | Alcoe et al. | 6,429,508 | B1 | 8/2002 | Gang |
| 5,886,397 | A | 3/1999 | Ewer | 6,437,429 | B1 | 8/2002 | Su et al. |
| 5,973,935 | A | 10/1999 | Schoenfeld et al. | 6,444,499 | B1 | 9/2002 | Swiss et al. |
| 5,977,630 | A | 11/1999 | Woodworth et al. | 6,448,633 | B1 | 9/2002 | Yee et al. |
| 6,143,981 | A | 11/2000 | Glenn | 6,452,279 | B2 | 9/2002 | Shimoda |
| 6,166,430 | A | 12/2000 | Yamaguchi | 6,459,148 | B1 | 10/2002 | Chun-Jen et al. |
| 6,169,329 | B1 | 1/2001 | Farnworth et al. | 6,464,121 | B2 | 10/2002 | Reijinders |
| 6,177,718 | B1 | 1/2001 | Kozono | 6,465,883 | B2 | 10/2002 | Oloffson |
| 6,181,002 | B1 | 1/2001 | Juso et al. | 6,472,735 | B2 | 10/2002 | Isaak |
| 6,184,465 | B1 | 2/2001 | Corisis | 6,475,646 | B2 | 11/2002 | Park et al. |
| 6,184,573 | B1 | 2/2001 | Pu | 6,476,469 | B2 | 11/2002 | Huang et al. |
| 6,194,777 | B1 | 2/2001 | Abbott et al. | 6,476,474 | B1 | 11/2002 | Hung |
| 6,197,615 | B1 | 3/2001 | Song et al. | 6,482,680 | B1 | 11/2002 | Khor et al. |
| 6,198,171 | B1 | 3/2001 | Huang et al. | 6,483,178 | B1 | 11/2002 | Chuang |
| 6,201,186 | B1 | 3/2001 | Daniels et al. | 6,492,718 | B2 | 12/2002 | Ohmori et al. |
| 6,201,292 | B1 | 3/2001 | Yagi et al. | 6,498,099 | B1 | 12/2002 | McClellan et al. |
| 6,204,554 | B1 | 3/2001 | Ewer et al. | 6,498,392 | B2 | 12/2002 | Azuma |
| 6,208,020 | B1 | 3/2001 | Minamio et al. | 6,507,096 | B2 | 1/2003 | Gang |
| 6,208,021 | B1 | 3/2001 | Ohuchi et al. | 6,507,120 | B2 | 1/2003 | Lo et al. |
| 6,208,023 | B1 | 3/2001 | Nakayama et al. | 6,518,089 | B2 | 2/2003 | Coyle |
| 6,211,462 | B1 | 4/2001 | Carter, Jr. et al. | 6,534,849 | B1 | 3/2003 | Gang |
| 6,218,731 | B1 | 4/2001 | Huang et al. | 6,545,332 | B2 | 4/2003 | Huang |
| 6,222,258 | B1 | 4/2001 | Asano et al. | 6,545,345 | B1 | 4/2003 | Glenn et al. |
| 6,222,259 | B1 | 4/2001 | Park et al. | 6,552,421 | B2 | 4/2003 | Kishimoto et al. |
| 6,225,146 | B1 | 5/2001 | Yamaguchi et al. | 6,559,525 | B2 | 5/2003 | Huang |
| 6,229,200 | B1 | 5/2001 | McClellan et al. | 6,566,168 | B2 | 5/2003 | Gang |
| 6,229,205 | B1 | 5/2001 | Jeong et al. | 6,580,161 | B2 | 6/2003 | Kobayakawa |
| 6,239,367 | B1 | 5/2001 | Hsuan et al. | 6,583,503 | B2 | 6/2003 | Akram et al. |
| 6,239,384 | B1 | 5/2001 | Smith et al. | 6,603,196 | B2 | 8/2003 | Lee et al. |
| 6,242,281 | B1 | 6/2001 | McClellan et al. | 6,624,005 | B1 | 9/2003 | DiCaprio et al. |
| 6,256,200 | B1 | 7/2001 | Lam et al. | 6,646,339 | B1 | 11/2003 | Ku |
| 6,258,629 | B1 | 7/2001 | Niones et al. | 6,667,546 | B2 | 12/2003 | Huang et al. |
| 6,281,566 | B1 | 8/2001 | Magni | 6,677,663 | B1 | 1/2004 | Ku et al. |
| 6,281,568 | B1 | 8/2001 | Glenn et al. | 6,686,649 | B1 | 2/2004 | Matthews et al. |
| 6,282,095 | B1 | 8/2001 | Houghton et al. | 6,696,752 | B2 | 2/2004 | Su et al. |
| 6,285,075 | B1 | 9/2001 | Combs et al. | 6,700,189 | B2 | 3/2004 | Shibata |
| 6,291,271 | B1 | 9/2001 | Lee et al. | 6,713,375 | B2 | 3/2004 | Shenoy |
| 6,291,273 | B1 | 9/2001 | Miyaki et al. | 6,757,178 | B2 | 6/2004 | Okabe et al. |
| 6,294,100 | B1 | 9/2001 | Fan et al. | 6,800,936 | B2 | 10/2004 | Kosemura et al. |
| 6,294,830 | B1 | 9/2001 | Fjelstad | 6,812,552 | B2 | 11/2004 | Islam et al. |
| 6,295,977 | B1 | 10/2001 | Ripper et al. | 6,858,919 | B2 | 2/2005 | Seo et al. |
| 6,297,548 | B1 | 10/2001 | Moden et al. | 6,867,492 | B2 | 3/2005 | Auburger et al. |
| 6,303,984 | B1 | 10/2001 | Corisis | 6,878,571 | B2 | 4/2005 | Isaak et al. |
| 6,303,997 | B1 | 10/2001 | Lee | 6,897,552 | B2 | 5/2005 | Nakao |
| 6,307,272 | B1 | 10/2001 | Takahashi et al. | 6,927,478 | B2 | 8/2005 | Paek |
| 6,309,909 | B1 | 10/2001 | Ohgiyama | 7,002,805 | B2 | 2/2006 | Lee et al. |
| 6,316,822 | B1 | 11/2001 | Vekateshwaran et al. | 7,005,327 | B2 | 2/2006 | Kung et al. |
| 6,316,838 | B1 | 11/2001 | Ozawa et al. | 7,015,571 | B2 | 3/2006 | Chang et al. |
| 6,323,550 | B1 | 11/2001 | Martin et al. | 7,053,469 | B2 | 5/2006 | Koh et al. |
| 6,326,243 | B1 | 12/2001 | Suzuya et al. | 7,102,209 | B1 | 9/2006 | Bayan et al. |
| 6,326,244 | B1 | 12/2001 | Brooks et al. | 7,185,426 | B1 | 3/2007 | Hiner et al. |
| 6,326,678 | B1 | 12/2001 | Karnezos et al. | 7,385,283 | B2 * | 6/2008 | Wu et al. .................... 257/686 |
| 6,335,564 | B1 | 1/2002 | Pour | 2001/0008305 | A1 | 7/2001 | McClellan et al. |
| 6,337,510 | B1 | 1/2002 | Chun-Jen et al. | 2001/0014538 | A1 | 8/2001 | Kwan et al. |
| 6,339,255 | B1 | 1/2002 | Shin | 2002/0011654 | A1 | 1/2002 | Kimura |
| 6,348,726 | B1 | 2/2002 | Bayan et al. | 2002/0024122 | A1 | 2/2002 | Jung et al. |
| 6,355,502 | B1 | 3/2002 | Kang et al. | 2002/0027297 | A1 | 3/2002 | Ikenaga et al. |
| 6,359,221 | B1 | 3/2002 | Yamada et al. | 2002/0038873 | A1 | 4/2002 | Hiyoshi |
| 6,362,525 | B1 | 3/2002 | Rahim | 2002/0111009 | A1 | 8/2002 | Huang et al. |
| 6,369,447 | B2 | 4/2002 | Mori | 2002/0140061 | A1 | 10/2002 | Lee |
| 6,369,454 | B1 | 4/2002 | Chung | 2002/0140068 | A1 | 10/2002 | Lee et al. |
| 6,373,127 | B1 | 4/2002 | Baudouin et al. | 2002/0140081 | A1 | 10/2002 | Chou et al. |
| 6,377,464 | B1 | 4/2002 | Hashemi et al. | 2002/0158318 | A1 | 10/2002 | Chen |
| 6,380,048 | B1 | 4/2002 | Boon et al. | 2002/0163015 | A1 | 11/2002 | Lee et al. |
| 6,384,472 | B1 | 5/2002 | Huang | 2002/0163072 | A1 * | 11/2002 | Gupta et al. ................ 257/698 |
| 6,388,336 | B1 | 5/2002 | Venkateshwaran et al. | 2002/0167060 | A1 | 11/2002 | Buijsman et al. |
| 6,395,578 | B1 | 5/2002 | Shin et al. | 2003/0006055 | A1 | 1/2003 | Chien-Hung et al. |
| 6,399,415 | B1 | 6/2002 | Bayan et al. | 2003/0030131 | A1 | 2/2003 | Lee et al. |
| 6,400,004 | B1 | 6/2002 | Fan et al. | 2003/0059644 | A1 | 3/2003 | Datta et al. |
| 6,410,979 | B2 | 6/2002 | Abe | 2003/0064548 | A1 | 4/2003 | Isaak |
| 6,414,385 | B1 | 7/2002 | Huang et al. | 2003/0073265 | A1 | 4/2003 | Hu et al. |
| 6,420,779 | B1 | 7/2002 | Sharma et al. | 2003/0102537 | A1 | 6/2003 | McLellan et al. |

| | | | | | | |
|---|---|---|---|---|---|---|
| 2003/0164554 | A1 | 9/2003 | Fee et al. | JP | 2129948 | 5/1990 |
| 2003/0168719 | A1 | 9/2003 | Cheng et al. | JP | 369248 | 7/1991 |
| 2003/0198032 | A1 | 10/2003 | Collander et al. | JP | 3177060 | 8/1991 |
| 2004/0027788 | A1 | 2/2004 | Chiu et al. | JP | 4098864 | 3/1992 |
| 2004/0056277 | A1 | 3/2004 | Karnezos | JP | 5129473 | 5/1993 |
| 2004/0061212 | A1 | 4/2004 | Karnezos | JP | 5166992 | 7/1993 |
| 2004/0061213 | A1 | 4/2004 | Karnezos | JP | 5283460 | 10/1993 |
| 2004/0063242 | A1 | 4/2004 | Karnezos | JP | 6061401 | 3/1994 |
| 2004/0063246 | A1 | 4/2004 | Karnezos | JP | 692076 | 4/1994 |
| 2004/0065963 | A1 | 4/2004 | Karnezos | JP | 6140563 | 5/1994 |
| 2004/0080025 | A1 | 4/2004 | Kasahara et al. | JP | 6260532 | 9/1994 |
| 2004/0089926 | A1 | 5/2004 | Hsu et al. | JP | 7297344 | 11/1995 |
| 2004/0164387 | A1 | 8/2004 | Ikenaga et al. | JP | 7312405 | 11/1995 |
| 2004/0251531 | A1* | 12/2004 | Yang et al. ............... 257/686 | JP | 8064364 | 3/1996 |
| 2004/0253803 | A1 | 12/2004 | Tomono et al. | JP | 8083877 | 3/1996 |
| 2005/0051883 | A1* | 3/2005 | Fukazawa ............... 257/686 | JP | 8125066 | 5/1996 |
| 2005/0184377 | A1* | 8/2005 | Takeuchi et al. ........... 257/686 | JP | 964284 | 6/1996 |
| 2005/0206012 | A1* | 9/2005 | Farnworth et al. ......... 257/782 | JP | 8222682 | 8/1996 |
| 2006/0087020 | A1 | 4/2006 | Hirano et al. | JP | 8306853 | 11/1996 |
| 2006/0157843 | A1 | 7/2006 | Hwang | JP | 98205 | 1/1997 |
| 2006/0231939 | A1 | 10/2006 | Kawabata et al. | JP | 98206 | 1/1997 |
| 2007/0045862 | A1* | 3/2007 | Corisis et al. ............. 257/777 | JP | 98207 | 1/1997 |
| 2007/0181998 | A1* | 8/2007 | Ha et al. ................. 257/723 | JP | 992775 | 4/1997 |
| | | | | JP | 9260568 | 10/1997 |

FOREIGN PATENT DOCUMENTS

| | | |
|---|---|---|
| JP | 9293822 | 11/1997 |
| EP | 0393997 | 10/1990 |
| JP | 10022447 | 1/1998 |
| EP | 0459493 | 12/1991 |
| JP | 10199934 | 7/1998 |
| EP | 0720225 | 3/1996 |
| JP | 10256240 | 9/1998 |
| EP | 0720234 | 3/1996 |
| JP | 11307675 | 11/1999 |
| EP | 0794572 A2 | 10/1997 |
| JP | 2000150765 | 5/2000 |
| EP | 0844665 | 5/1998 |
| JP | 20010600648 | 3/2001 |
| EP | 0989608 | 3/2000 |
| JP | 2002519848 | 7/2002 |
| EP | 1032037 | 8/2000 |
| JP | 200203497 | 8/2002 |
| JP | 55163868 | 12/1980 |
| KR | 941979 | 1/1994 |
| JP | 5745959 | 3/1982 |
| KR | 19940010938 | 5/1994 |
| JP | 58160096 | 8/1983 |
| KR | 19950018924 | 6/1995 |
| JP | 59208756 | 11/1984 |
| KR | 19950041844 | 11/1995 |
| JP | 59227143 | 12/1984 |
| KR | 19950044554 | 11/1995 |
| JP | 60010756 | 1/1985 |
| KR | 19950052621 | 12/1995 |
| JP | 60116239 | 8/1985 |
| KR | 1996074111 | 12/1996 |
| JP | 60195957 | 10/1985 |
| KR | 9772358 | 11/1997 |
| JP | 60231349 | 11/1985 |
| KR | 100220154 | 6/1999 |
| JP | 6139555 | 2/1986 |
| KR | 20000072714 | 12/2000 |
| JP | 61248541 | 11/1986 |
| KR | 20000086238 | 12/2000 |
| JP | 629639 | 1/1987 |
| KR | 20020049944 | 6/2002 |
| JP | 6333854 | 2/1988 |
| WO | EP0936671 | 8/1999 |
| JP | 63067762 | 3/1988 |
| WO | 9956316 | 11/1999 |
| JP | 63188964 | 8/1988 |
| WO | 9967821 | 12/1999 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

REDUCED SIZE STACKED SEMICONDUCTOR PACKAGE AND METHOD OF MAKING THE SAME

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to integrated circuit chip package technology and, more particularly, to a reduced size stacked semiconductor package and method of making the same.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component. In certain semiconductor packages, a portion of the die attach pad or die pad of the leadframe also remains exposed within the package body. In other semiconductor packages, the metal leadframe is substituted with a laminate substrate to which the semiconductor die is mounted and which includes pads or terminals for mimicking the functionality of the leads and establishing electrical communication with another device.

Once the semiconductor dies have been produced and encapsulated in the semiconductor packages described above, they may be used in a wide variety of electronic devices. The variety of electronic devices utilizing semiconductor packages has grown dramatically in recent years. These devices include cellular phones, portable computers, etc. Each of these devices typically includes a printed circuit board on which a significant number of such semiconductor packages are secured to provide multiple electronic functions. These electronic devices are typically manufactured in reduced sizes and at reduced costs, which results in increased consumer demand. Accordingly, not only are semiconductor dies highly integrated, but also semiconductor packages are highly miniaturized with an increased level of package mounting density.

Even though semiconductor packages have been miniaturized, space on a printed circuit board remains limited and precious. Thus, there is a need to find a semiconductor package design to maximize the number of semiconductor packages that may be integrated into an electronic device, yet minimize the space needed to accommodate these semiconductor packages. One method to minimize space needed to accommodate the semiconductor packages is to stack the semiconductor packages, individual semiconductor dies, or other devices on top of each other, or to stack the semiconductor dies or other devices within the package body of a semiconductor package. However, when attempting to integrate more than two or three devices such as memory chips into a vertical stack, test yield loss typically becomes higher as more such devices are assembled in a single package.

Additionally, many existing stacked packages include a substrate which is larger than the stacked semiconductor dies included in the package. As a result of the typical encapsulation of the semiconductor dies in such packages by an encapsulant material, the size of such packages is usually considerably larger than that of the semiconductor dies included therein, thus creating difficulties in realizing a true chip scale package. Moreover, for widely used stacked combinations such as a memory/memory combination, a memory/logic combination, a memory/ASIC combination, or a flash/SRAM combination, such a combination of devices generally reduces the number of input/output or I/O. For example, in a flash/SRAM combination which is widely used in cellular phones, it is only possible to share about 50% of the I/O. The I/O is collected to the substrate of the package and then routed by a PCB, with the two semiconductor dies thus sharing the I/O. Still further, since stacked packages often employ the use of gold wires, solder bumps, substrates and the like to achieve prescribes patterns of electrical signal routing, these particular features often give rise to problems such as cross torque which create difficulties in using such packages in high frequency regions. Therefore, a new solution is needed, such solution being provided by the present invention which is discussed in detail below.

BRIEF SUMMARY OF THE INVENTION

In accordance with the present invention, there is provided multiple embodiments of a reduced size stackable semiconductor package. In a basic embodiment of the present invention, the semiconductor package comprises a bulk layer having at least one first bond pad formed therein. At least one active layer is formed on the bulk layer and electrically coupled to the first bond pad. Additionally, at least one second bond pad is formed on the active layer and is electrically coupled thereto. A protection layer is formed on that surface of the active layer having the second bond pad formed thereon, the protection layer also partially encapsulating the second bond pad.

In other embodiments of the present invention, the above-described semiconductor package is provided in a stacked arrangement and in a prescribed pattern of electrical communication with one or more additional, identically configured semiconductor packages. In these stacked arrangements, one or more interposers and/or solder balls may optionally integrated into such semiconductor package stacks. In other embodiments of the present invention, a semiconductor package is provided wherein a semiconductor package stack is itself electrically connected to a substrate and covered with an encapsulant material which ultimately hardens into a package body.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
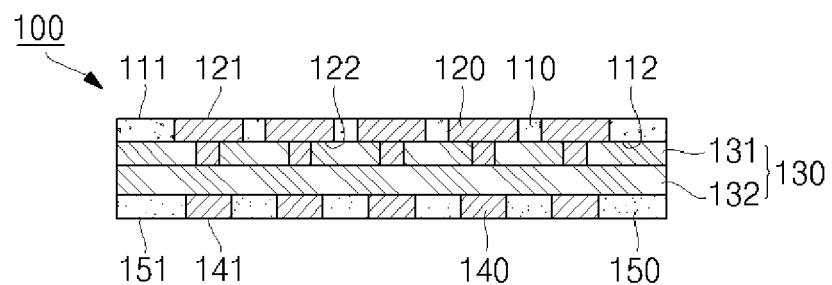
FIG. 1 is a cross-sectional view of a semiconductor package constructed in accordance with a first embodiment of the present invention.

Referring now to the drawings wherein the showings are for purposes of illustrating various embodiments of the present invention only, and not for purposes of limiting the same, FIG. 1 illustrates a semiconductor package 100 constructed in accordance with a first embodiment of the present invention. The semiconductor package 100 comprises a bulk layer 110 which may be fabricated from silicon, glass, a polymer, or equivalent materials thereto. However, the present invention is not intended to be limited to any particular material for the bulk layer 110. Formed in the bulk layer 110 is at least one, and preferably a plurality of first bond pads 120. In the semiconductor package 100, each of the first bond pads 120 may be formed of aluminum, copper or equivalent materials thereto, though the present invention is not intended to be limited to any particular material for each of the first bond pads 120. Additionally, as is seen in FIG. 1, the first bond pads 120 are formed in the bulk layer 110 such that each of the first bond pads 120 defines a generally planar first (top) surface 121 which extends in generally co-planar relation to a generally planar first (top) surface 111 of the bulk layer 110, and an opposed, generally planar second (bottom) surface 122 which extends in generally co-planar relation to a generally planar second (bottom) surface 112 of the bulk layer 110.

In addition to the bulk layer 110 having the first bond pads 120 formed therein, the semiconductor package 100 comprises an active layer 130 which is formed on the bottom surface 112 of the bulk layer 110 and is electrically coupled to the first bond pads 120. The active layer 130 may be formed from mono-crystalline silicon, poly-crystalline silicon, amorphous silicon, and equivalent materials thereto. Additionally, it is contemplated that the active layer 130 may comprise multiple layers rather than a single layer. As shown in FIG. 1, the active layer 130 actually comprises the combination of a first active layer 131 and a second active layer 132. In the semiconductor package 100, it is contemplated that the active layer 130 may be an integrated circuit such as a transistor, a diode, a capacitor, a resistor, a wiring circuit or the like which is adapted to carry out a prescribed electrical function.

The semiconductor package 100 of the first embodiment further comprises at least one, and preferably a plurality of second bond pads 140 which are each electrically coupled to the active layer 130. Each of the second bond pads 140 may be formed from aluminum, copper, and equivalent materials thereto, though the present invention is not intended to be limited to any particular material for the second bond pads 140.

As is further seen in FIG. 1, in the semiconductor package 100, the second bond pads 140 are preferably partially encapsulated by a protection layer 150 which is applied to the active layer 130, and in particular the second active layer 132 thereof. More particularly, the protection layer 150 is preferably formed such that a generally planar first surface 141 of each of the second bond pads 140 is exposed in and extends in generally co-planar relation to an exposed, generally planar first surface 151 defined by the protection layer 150. The protection layer 150 may be formed from a typical polymer resin or equivalent materials thereto, though the present invention is not intended to be limited to any particular material for the protection layer 150. The completed semiconductor package 100 shown in FIG. 1 maximizes the number of I/O due to the formation of the first bond pads 120 on the upper part of the semiconductor package 100 and the formation of the second bond pads 140 on the lower part thereof.

Figure 2:
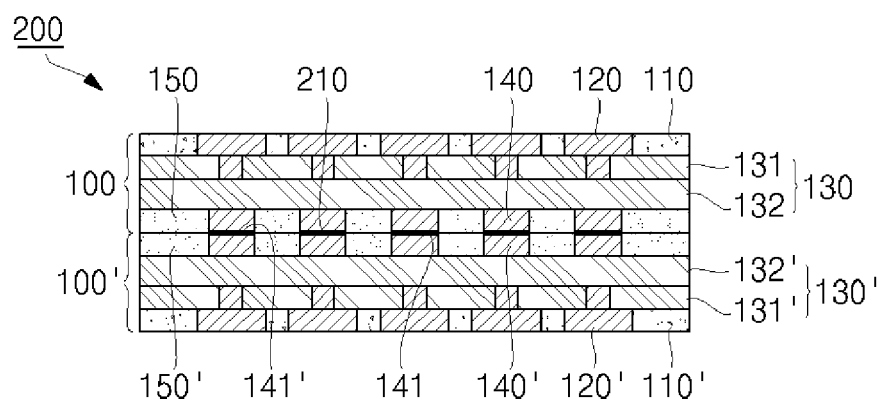
FIG. 2 is a cross-sectional view of a semiconductor package constructed in accordance with a second embodiment of the present invention.

Referring now to FIG. 2, there is shown a semiconductor package 200 constructed in accordance with a second embodiment of the present invention. The semiconductor package 200 essentially comprises two of the semiconductor package 100 as shown and described in relation to FIG. 1. However, for purposes of clarity, in FIG. 2, the reference numbers used in conjunction with the uppermost one of the two semiconductor packages 100, 100' included in the semiconductor package 200 are identical to those used in FIG. 1, with the reference numbers used in conjunction with the lowermost one of the two semiconductor packages 100, 100' also being identical to those shown in FIG. 1, but accompanied by an apostrophe for purposes of differentiating the same from those used in relation to the uppermost semiconductor package 100. However, as indicated above, the upper and lower semiconductor packages 100, 100' included in the semiconductor package 200 are identically configured to each other.

As is further seen in FIG. 2, in the semiconductor package 200, the second bond pads 140 of the semiconductor package 100 are electrically connected to respective ones of the second bond pads 140' of the semiconductor package 100'. Such electrical connection is preferably facilitated by interposing solder layers 210 between corresponding pairs of the second bond pads 140, 140', and more particularly between the first surfaces 141, 141' thereof. Those of ordinary skill in the art will recognize that the solder layers 210 may be substituted with other materials such as gold, silver, nickel, palladium or other equivalent materials, the present invention not being limited to any particular material for use in electrically connecting the second bond pads 140, 140' of the semiconductor packages 100, 100' to each other.

Figure 3:
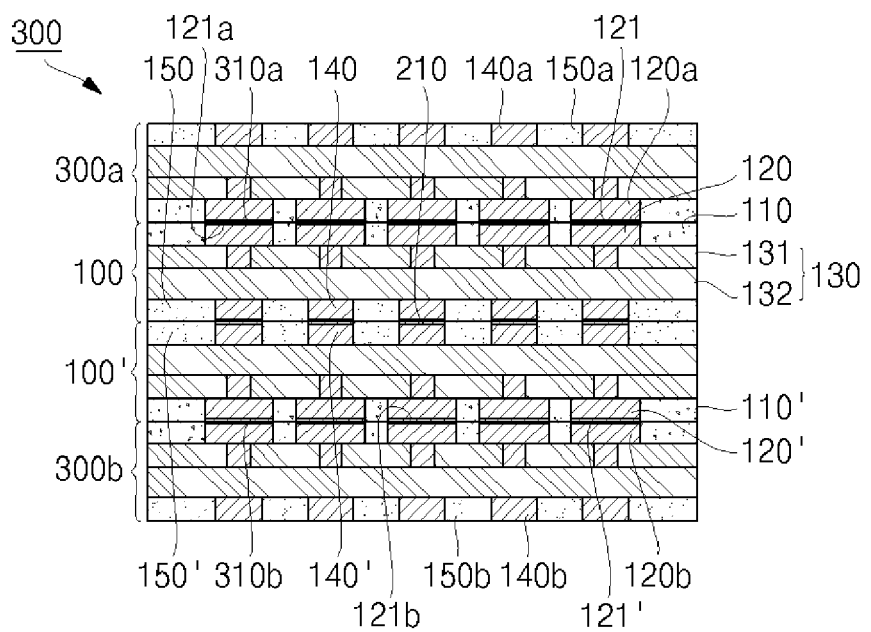
FIG. 3 is a cross-sectional view of a semiconductor package constructed in accordance with a third embodiment of the present invention.

Referring now to FIG. 3, there is shown a semiconductor package 300 constructed in accordance with a third embodiment of the present invention. The semiconductor package 300 comprises the semiconductor package 200 shown in FIG. 2, with the addition of two more semiconductor packages 300a, 300b which are each identically configured to the semiconductor package 100 shown and described above in relation to FIG. 1. Thus, the semiconductor package 300 shown in FIG. 3 comprises four of the semiconductor packages 100 shown in FIG. 1 as electrically connected to each other in a prescribed stacked arrangement. Along these lines, in FIG. 3, the upper middle and lower middle semiconductor packages are identified with respective ones of the reference numbers 100, 100', and are provided in the same stacked arrangement shown in FIG. 2. The uppermost semiconductor package in the semiconductor package 300, while being identically configured to the semiconductor package 100, is labeled with the reference number 300a, with the elements thereof bearing the same reference numbers shown in relation to FIG. 1 but accompanied by the lower case letter "a." Similarly, the lowermost semiconductor package in the semiconductor package 300, while also being identically configured to the semiconductor package 100, is labeled with the reference number 300b, with the elements thereof bearing the same reference numbers shown in relation to FIG. 1 but accompanied by the lower case letter "b."

As is further seen in FIG. 3, in the semiconductor package 300, the second bond pads 140 of the semiconductor package 100 are electrically connected to respective ones of the second bond pads 140' of the semiconductor package 100' through the use of the solder layers 210 described above in relation to FIG. 2. Additionally, the first bond pads 120 of the semiconductor package 100 are electrically connected to respective ones of the first bond pads 120a of the semiconductor package 300a. Such electrical connection is preferably facilitated by interposing solder layers 310a between corresponding pairs of the first bond pads 120, 120a, and more particularly between the first surfaces 121, 121a thereof. Similarly, the first bond pads 120' of the semiconductor package 100' are electrically connected to respective ones of the first bond pads 120b of the semiconductor package 300b. Such electrical connection is preferably facilitated by interposing solder layers 310b between corresponding pairs of the first bond pads 120', 120b, and more particularly between the first surfaces 121', 121b thereof. Those of ordinary skill in the art will recognize that the solder layers 310a, 310b may be substituted with other materials such as gold, silver, nickel, palladium or other equivalent materials without departing from the spirit and scope of the present invention.

Figure 4:
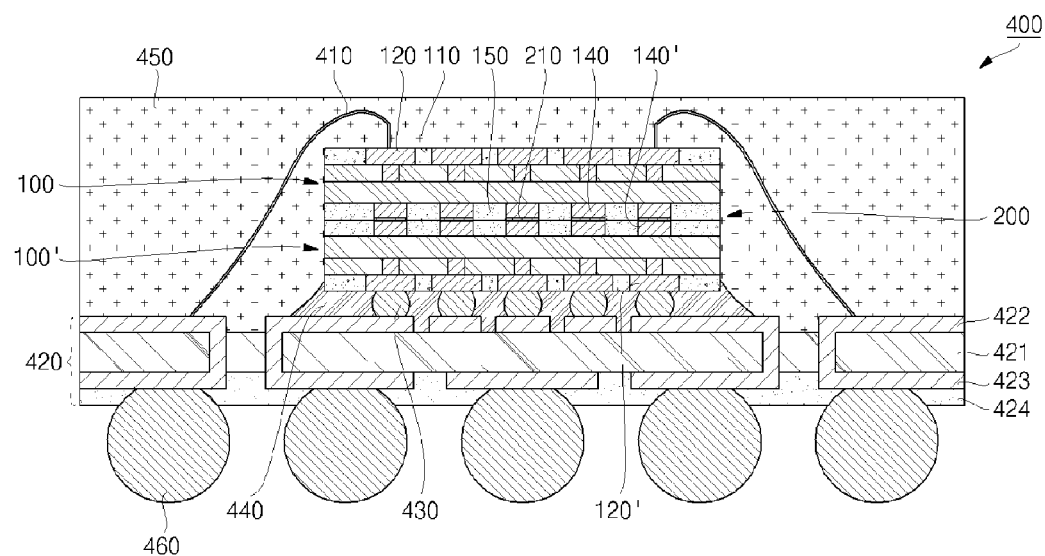
FIG. 4 is a cross-sectional view of a semiconductor package constructed in accordance with a fourth embodiment of the present invention.

Referring now to FIG. 4, there is shown a semiconductor package 400 constructed in accordance with a fourth embodiment of the present invention. The semiconductor package 400 comprises the semiconductor package 200 shown and described in relation to FIG. 2. In addition to such semiconductor package 200, the semiconductor package 400 comprises a substrate 420. The substrate 420 comprises an insulation layer 421 which defines opposed, generally planar first (top) and second (bottom) surfaces. Formed on respective ones of the first and second surfaces of the insulation layer 421 are conductive patterns or wiring patterns 422, 423 which are electrically connected to each other in a prescribed pattern or arrangement by conductive vias which extend through the insulation layer 421 in the manner shown in FIG. 4. In particular, the wiring patterns 422 are formed on the first, top surface of the insulation layer 421, with the wiring patterns 423 being formed on the second, bottom surface thereof. Electrically coupled to the wiring patterns 423 formed on the bottom surface of the insulation layer 421 is a plurality of solder balls 460. The substrate 420 may further comprise a protective layer 424 which is formed on the bottom surface of the insulation layer 421, and covers the exposed portions of the wiring patterns 423. As seen in FIG. 4, the protective layer 424, if included, may also extend into contact with portions of the solder balls 460.

In the semiconductor package 400, the first bond pads 120' of the semiconductor package 100' included therein are electrically connected to the wiring patterns 422 of the substrate 420 through the use of conductive bumps 430. It is contemplated that the conductive bumps 430 may be encapsulated by an underfill material 440 which also effectively increases the coupling force between the semiconductor package 100' and the substrate 420. In addition to the semiconductor package 100' of the semiconductor package 200 being electrically coupled to the wiring patterns 422 in the above-described manner, the first semiconductor package 100 thereof is also electrically connected to such first wiring patterns 422. More particularly, as is further shown in FIG. 4, each of the first bond pads 120 of the semiconductor package 100 is electrically connected to the wiring patterns 422 through the use of a conductive wire 410. In the semiconductor package 400, the semiconductor package 200, the underfill 440, the conductive wires 410, the exposed portion of the first, top surface of the insulation layer 421, and the exposed portions of the wiring patterns 422 disposed on the first surface of the insulation layer 421 are each covered by an encapsulant material which hardens into a package body 450 of the semiconductor package 400. Though the semiconductor package 400 has been described as including the substrate 420, those of ordinary skill in the art will recognize that such substrate 420 may be substituted with other structures such as a leadframe, ceramic, or equivalents thereto without departing from the spirit and scope of the present invention.

Figure 5:
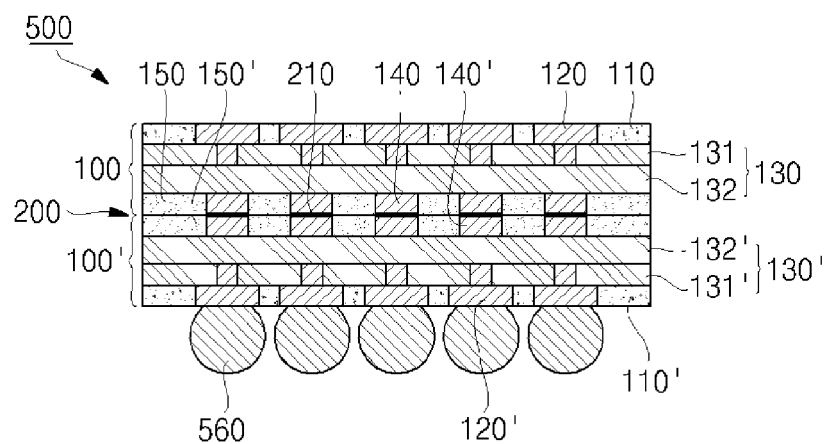
FIG. 5 is a cross-sectional view of a semiconductor package constructed in accordance with a fifth embodiment of the present invention.

Referring now to FIG. 5, there is shown a semiconductor package 500 constructed in accordance with a fifth embodiment of the present invention. The semiconductor package 500 is substantially identical to the semiconductor package 200 described above in relation to FIG. 2, except that each of the first bond pads 120' of the semiconductor package 100' included in the semiconductor package 200 includes a solder ball 560 electrically coupled thereto. Though not shown in FIG. 5, those of ordinary skill in the art will further recognize that solder balls 560 may be electrically coupled to respective ones of the first bond pads 120 of the semiconductor package 100 included in the semiconductor package 200, rather than forming such solder balls 560 on the first bond pads 120' of the semiconductor package 100'.

Figure 6:
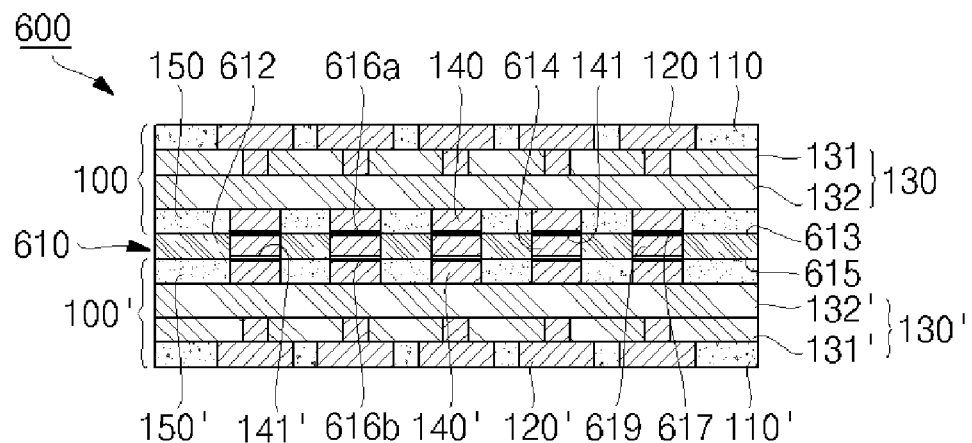
FIG. 6 is a cross-sectional view of a semiconductor package constructed in accordance with a sixth embodiment of the present invention.

Referring now to FIG. 6, there is shown a semiconductor package 600 constructed in accordance with a sixth embodiment of the present invention. The semiconductor package 600 of the sixth embodiment is substantially identical to the semiconductor package 200 shown and described above in relation to FIG. 2, with the sole exception lying in the substitution of the above-described solder layers 210 used to electrically couple the semiconductor packages 100, 100' to each other with an inter-layer or interposer 610. The interposer 610 comprises an insulation layer 612. Formed in the insulation layer 612 are at least one, and preferably a plurality of conductive pads 614. The conductive pads 614 are formed in the insulation layer 612 such that each of the conductive pads 614 defines a generally planar first (top) surface 617 which extends in generally co-planar relation to a generally planar first (top) surface 613 of the insulation layer 612, and an opposed, generally planar second (bottom) surface 619 which extends in generally co-planar relation to a generally planar second (bottom) surface 615 of the insulation layer 612.

In the semiconductor package 600, the second bond pads 140 of the semiconductor package 100 are electrically connected to respective ones of the conductive pads 614 of the interposer 610. Such electrical connection is preferably facilitated by interposing solder layers 616a between corresponding pairs of the pads 140, 614, and more particularly between the first surfaces 141 of the second bond pads 140 and respective ones of the first surfaces 617 of the conductive pads 614. Similarly, the second bond pads 140' of the semiconductor package 100' are electrically connected to respective ones of the conductive pads 614 of the interposer 610. Such electrical connection is preferably facilitated by interposing solder layers 616b between corresponding pairs of the pads 140', 614, and more particularly between the first surfaces 141' of the second bond pads 140' and respective ones of the second surfaces 619 of the conductive pads 614. Those of ordinary skill in the art will recognize that the solder layers 616a, 616b may be substituted with other materials such as gold, silver, nickel, palladium or other equivalent materials without departing from the spirit and scope of the present invention.

In the semiconductor package 600, the interposer 610 is used to facilitate the I/O routing between the semiconductor packages 100, 100' in a prescribed pattern or arrangement. As shown in FIG. 6, each conductive pad 614 of the interposer 610 electrically couples a second bond pad 140 of the semiconductor package 100 to a second bond pad 140' of the semiconductor package 100' that is positioned opposite thereto and thus vertically aligned therewith. However, those of ordinary skill in the art will recognize that the interposer 610 may be configured so as to electrically couple any second bond pad 140 of the semiconductor package 100 to a second bond pad 140' of the semiconductor package 100' that is not vertically aligned therewith. In this regard, wiring patterns may be formed on the first and second surfaces 613, 615 of the insulation layer 612 of the interposer 610 as needed to facilitate this alternative arrangement.

Figure 7:
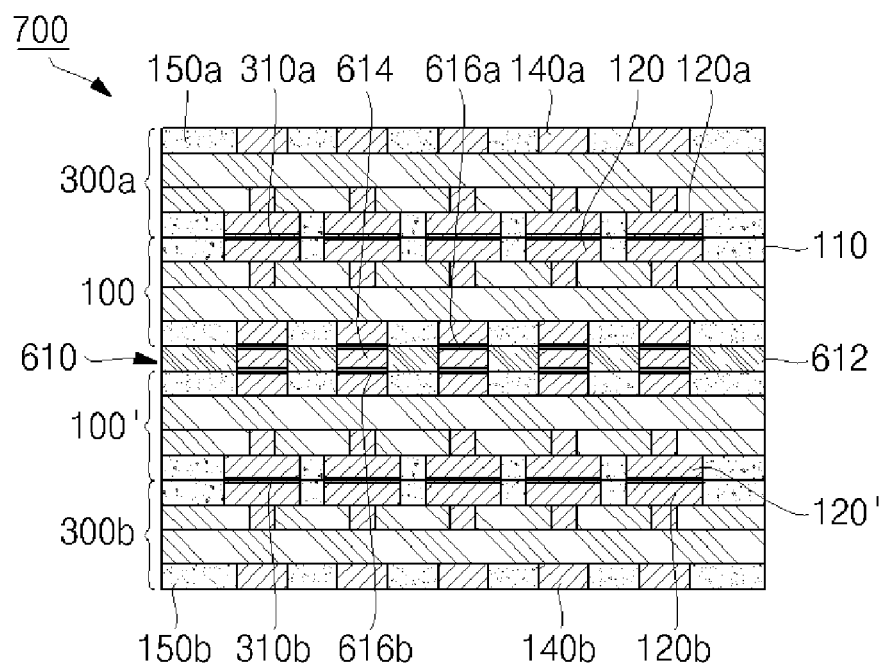
FIG. 7 is a cross-sectional view of a semiconductor package constructed in accordance with a seventh embodiment of the present invention.

Referring now to FIG. 7, there is shown a semiconductor package 700 constructed in accordance with a seventh embodiment of the present invention. The semiconductor package 700 of the seventh embodiment is substantially identical to the semiconductor package 300 shown and described above in relation to FIG. 3, with the sole exception lying in the substitution of the above-described solder layers 210 used to electrically couple the semiconductor packages 100, 100' to each other in the semiconductor package 300 with the interposer 610 described above in relation to the semiconductor package 600 shown in FIG. 6. In this regard, the structural attributes of the interposer 610 and the manner in which the same is used to facilitate the electrical connection of the semiconductor packages 100, 100' of the semiconductor package 700 to each other is the same as described above in relation to the semiconductor package 600 shown in FIG. 6. Though not shown in FIG. 7, it is further contemplated that one or more additional interposers similar to the interposer 610 may be integrated between the semiconductor packages 100, 300a and/or between the semiconductor packages 100', 300b.

Figure 8:
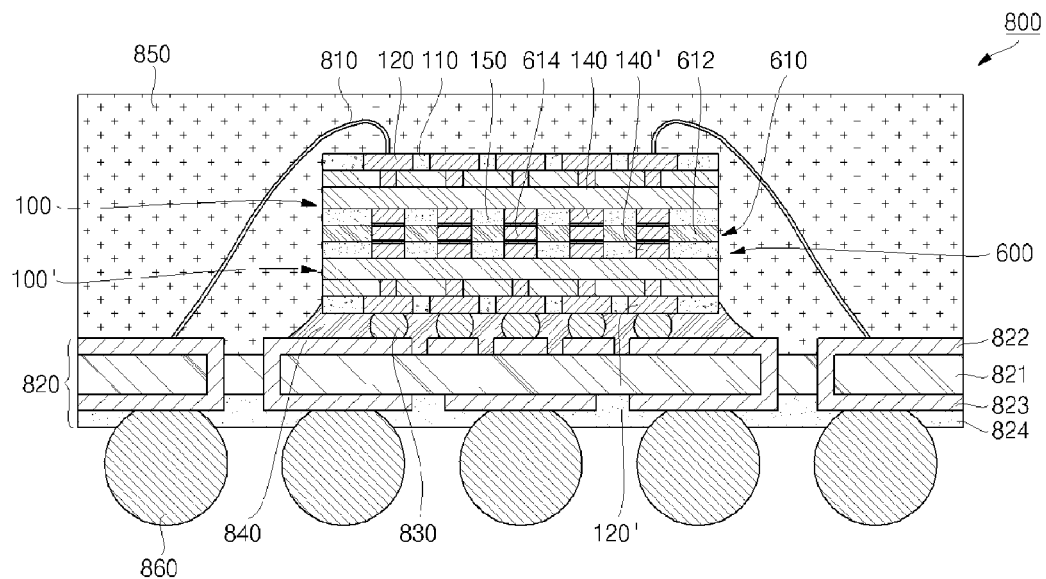
FIG. 8 is a cross-sectional view of a semiconductor package constructed in accordance with an eighth embodiment of the present invention.

Referring now to FIG. 8, there is shown a semiconductor package 800 constructed in accordance with an eighth embodiment of the present invention. The semiconductor package 800 of the eighth embodiment is substantially identical to the semiconductor package 400 shown and described above in relation to FIG. 4, with the sole distinction lying in the substitution of the semiconductor package 200 included in the semiconductor package 400 with the semiconductor package 600 shown and described above in relation to FIG. 6. Additionally, for purposes of clarity, the 800 series reference numerals included in FIG. 8 are used to identify the same elements identified by respective ones of the corresponding 400 series reference numerals included in FIG. 4.

Figure 9:
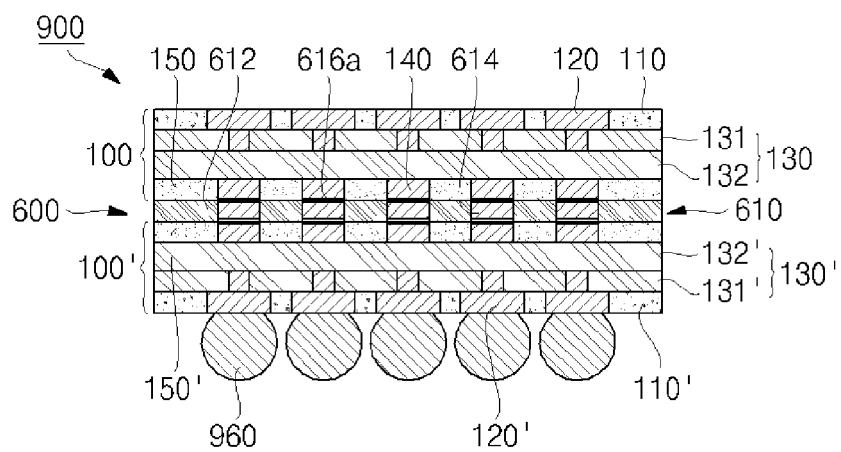
FIG. 9 is a cross-sectional view of a semiconductor package constructed in accordance with a ninth embodiment of the present invention.

Referring now to FIG. 9, there is shown a semiconductor package 900 constructed in accordance with a ninth embodiment of the present invention. The semiconductor package 900 is substantially identical to the semiconductor package 600 described above in relation to FIG. 6, except that each of the first bond pads 120' of the semiconductor package 100' included in the semiconductor package 600 includes a solder ball 960 electrically coupled thereto. Though not shown in FIG. 9, those of ordinary skill in the art will further recognize that solder balls 960 may be electrically coupled to respective ones of the first bond pads 120 of the semiconductor package 100 included in the semiconductor package 900, rather than forming such solder balls 960 on the first bond pads 120' of the semiconductor package 100'.

Figure 10:
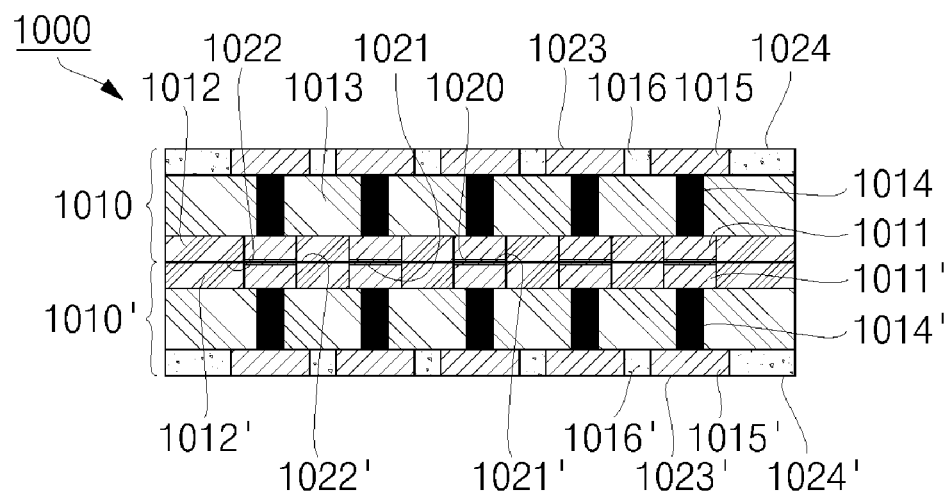
FIG. 10 is a cross-sectional view of a semiconductor package constructed in accordance with a tenth embodiment of the present invention.

Referring now to FIG. 10, there is shown a semiconductor package 1000 constructed in accordance with a tenth embodiment of the present invention. The semiconductor package 1000 includes a semiconductor package 1010 comprising an active layer 1012 which includes at least one, and preferably a plurality of first bond pads 1011 electrically coupled thereto. As is seen in FIG. 10, the first bond pads 1011 are arranged within the active layer 1012 such that each of the first bond pads 1011 defines a generally planar first surface 1021 which extends in generally co-planar relation to and exposed, generally planar first surface 1022 defined by the active layer 1012. The semiconductor package 1010 further includes a bulk layer 1013 which is applied to the first bond pads 1011 and active layer 1012 in the manner shown in FIG. 10. More particularly, the bulk layer 1013 is applied to generally planar surfaces defined by the first bond pads 1011 and active layer 1012 which are disposed in opposed relation to the first surfaces 1021, 1022 thereof. Extending through the bulk layer 1013 is a plurality of conductive vias 1014, each of which is electrically coupled to a respective one of the first bond pads 1011.

The semiconductor package 1010 further comprises at least one, and preferably a plurality of second bond pads 1015 which are electrically connected to respective ones of the conductive vias 1014. As is further seen in FIG. 10, the second bond pads 1015 are preferably partially encapsulated by a protection layer 1016 which is applied to the bulk layer 1013. More particularly, the protection layer 1016 is preferably formed such that a generally planar first surface 1023 of each of the second bond pads 1015 which is opposite that surface electrically connected to a respective one of the conductive vias 1014 is exposed in and extends in generally co-planar relation to an exposed, generally planar first surface 1024 defined by the protection layer 1016.

In addition to the semiconductor package 1010, the semiconductor package 1000 of the tenth embodiment includes a semiconductor package 1010' which is identically configured to the semiconductor package 1010. For purposes of clarity, in FIG. 10, the reference numbers used in conjunction with the semiconductor package 1010' are identical to those used in conjunction with the semiconductor package 1010, but are accompanied by an apostrophe to differentiate the same from those reference numbers used in relation to the semiconductor package 1010. However, as indicated above, the upper and lower semiconductor packages 1010, 1010' included in the semiconductor package 1000 are identically configured to each other.

As is further seen in FIG. 10, in the semiconductor package 1000, the first bond pads 1011 of the semiconductor package 1010 are electrically connected to respective ones of the first bond pads 1011' of the second semiconductor package 1010'. Such electrical connection is preferably facilitated by interposing solder layers 1020 between corresponding pairs of the first bond pads 1011, 1011', and more particularly between the first surfaces 1021, 1021' thereof. Those of ordinary skill in the art will recognize that the solder layers 1020 may be substituted with other materials such as gold, silver, nickel, palladium or other equivalent materials, the present invention not being limited to any particular material for use in electrically connecting the first bond pads 1011, 1011' of the semiconductor packages 1010, 1010' to each other.

Figure 11:
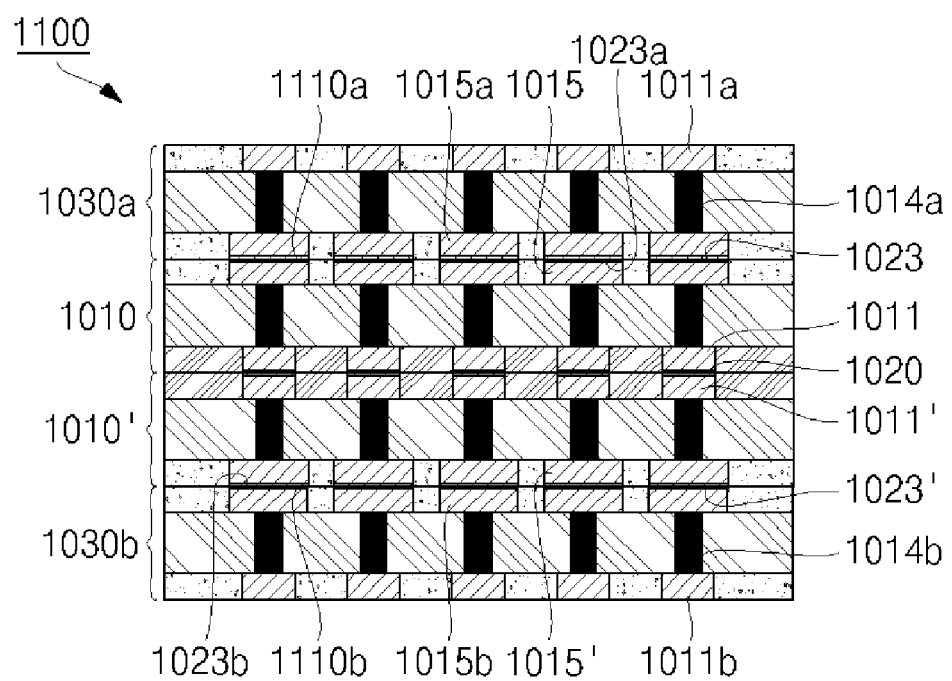
FIG. 11 is a cross-sectional view of a semiconductor package constructed in accordance with an eleventh embodiment of the present invention.

Referring now to FIG. 11, there is shown a semiconductor package 1100 constructed in accordance with an eleventh embodiment of the present invention. The semiconductor package 1100 comprises the semiconductor package 1000 shown in FIG. 10, with the addition of two more semiconductor packages 1030a, 1030b which are each identically configured to the semiconductor package 1010 shown and described in relation to FIG. 10. Thus, the semiconductor package 1100 shown in FIG. 11 comprises four of the semiconductor packages 1010 as electrically connected to each other in a prescribed stacked arrangement. Along these lines, in FIG. 11, the upper middle and lower middle semiconductor packages are identified with respective ones of the reference numbers 1010, 1010', and are provided in the same stacked arrangement shown and described in relation to FIG. 10. The uppermost semiconductor package 1100, while being identically configured to the semiconductor packages 1010, 1010', is labeled with the reference number 1030a, with the elements thereof bearing the same reference numbers shown in relation to FIG. 10 but accompanied by the lower case letter "a." Similarly, the lowermost semiconductor package in the semiconductor package 1100, while also being identically configured to the semiconductor package 1010, 1010', is labeled with the reference number 1030b, with the elements thereof bearing the same reference numbers shown in relation to FIG. 10 but accompanied by the lower case "b."

As shown in FIG. 11, in the semiconductor package 1100, the first bond pads 1011 of the semiconductor package 1010 are electrically connected to respective ones of the first bond pads 1011' of the semiconductor package 1010' through the use of the solder layers 1020 described above in relation to FIG. 10. Additionally, the second bond pads 1015 of the semiconductor package 1010 are electrically connected to respective ones of the second bond pads 1015a of the semiconductor package 1030a. Such electrical connection is preferably facilitated by interposing solder layers 1110a between corresponding pairs of the second bond pads 1015, 1015a, and more particularly between the first surfaces 1023, 1023a thereof. Similarly, the second bond pads 1015' of the semiconductor package 1010' are electrically connected to respective ones of the second bond pads 1015b of the semiconductor package 1030b. Such electrical connection is preferably facilitated by interposing solder layers 1110b between corresponding pairs of the second bond pads 1015', 1015b, and more particularly between the first surfaces 1023', 1023b thereof. Those of ordinary skill in the art will recognize that the solder layers 1110a, 1110b may be substituted with other materials such as gold, silver, nickel, palladium materials without departing from the spirit and scope of the present invention.

Figure 12:
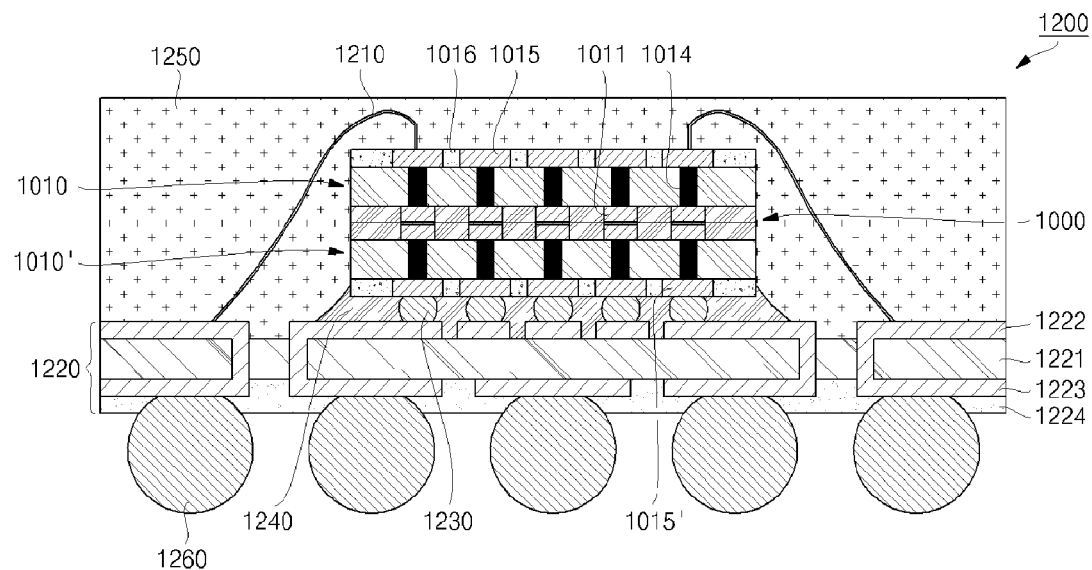
FIG. 12 is a cross-sectional view of a semiconductor package constructed in accordance with a twelfth embodiment of the present invention.

Referring now to FIG. 12, there is shown a semiconductor package 1200 constructed in accordance with a twelfth embodiment of the present invention. The semiconductor package 1200 comprises the semiconductor package 1000 shown and described in relation to FIG. 10. In addition to such semiconductor package 1000, the semiconductor package 1200 comprises a substrate 1220. The substrate 1220 comprises an insulation layer 1221 which defines opposed, generally planar first (top) and second (bottom) surfaces. Formed on respective ones of the first and second surfaces of the insulation layer 1221 are wiring patters 1222, 1223 which are electrically connected to each other in a prescribed pattern or arrangement by conductive vias which extend through the insulation layer 1221 in the manner shown in FIG. 12. In particular, the wiring patterns 1222 are formed on the first, top surface of the insulation layer 1221, with the wiring patterns 1223 being formed on the second, bottom surface thereof. Electrically coupled to the wiring patterns 1223 formed on the bottom surface of the insulation layer 1221 is a plurality of solder balls 1260. The substrate 1220 may further comprise a protective layer 1224 which is formed on the bottom surface of the insulation layer 1221, and covers the exposed portions of the wiring patters 1223. As seen in FIG. 12, the protective layer 1224, if included, may also extend into contact with portions of the solder balls 1260.

In the semiconductor package 1200, the second bond pads 1015' of the semiconductor package 1010' included therein are electrically connected to the wiring patterns 1222 of the substrate 1220 through the use of conductive bumps 1230. It is contemplated that the conductive bumps 1230 may be encapsulated by an underfill material 1240 which also effectively increases the coupling force between the semiconductor package 1010' and the substrate 1220. In addition to the semiconductor package 1010' of the semiconductor package 1000 being electrically coupled to the wiring patterns 1222 in the above-described manner, the first semiconductor package 1010 thereof is also electrically connected to such first wiring patterns 1222. More particularly, as is further shown in FIG. 12, each of the second bond pads 1015 of the semiconductor package 1010 is electrically connected to the wiring patterns 1222 through the use of a conductive wire 1210. In the semiconductor package 1200, the semiconductor package 1000, the underfill 1240, the conductive wires 1210, the exposed portion of the first, top surface of the insulation layer 1221, and the exposed portions of the wiring patterns 1222 disposed on the first surface of the insulation layer 1221 are each covered by an encapsulant material which hardens into a package body 1250 of the semiconductor package 1200. Though the semiconductor package 1200 has been described as including the substrate 1220, those of ordinary skill in the art will recognize that such substrate 1220 may be substituted with other structures such as a leadframe, ceramic, or equivalents thereto without departing from the spirit and scope of the present invention.

Figure 13:
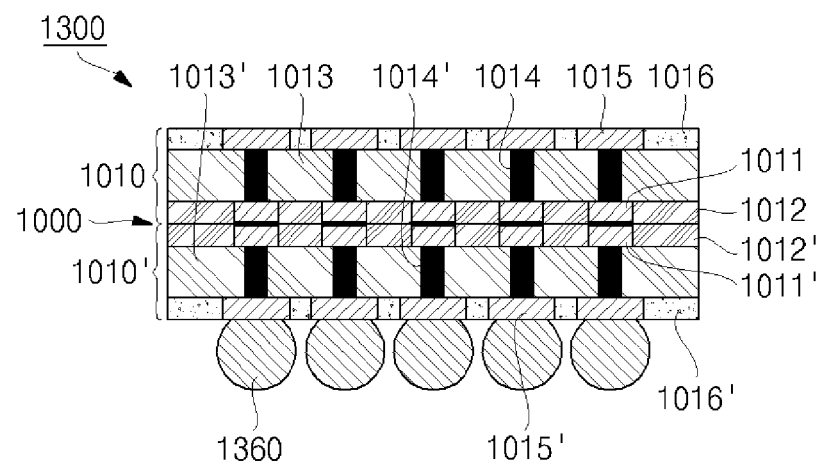
FIG. 13 is a cross-sectional view of a semiconductor package constructed in accordance with a thirteenth embodiment of the present invention.

Referring now to FIG. 13, there is shown a semiconductor package 1300 constructed in accordance with a thirteenth embodiment of the present invention. The semiconductor package 1300 is substantially identical to the semiconductor package 1000 described above in relation to FIG. 10, except that each of the second bond pads 1015' of the semiconductor package 1010' included in the semiconductor package 1300 includes a solder ball 1360 electrically coupled thereto. Though not shown in FIG. 13, those of ordinary skill in the art will further recognize that solder balls 1360 may be electrically coupled to respective ones of the second bond pads 1015 of the semiconductor package 1010 included in the semiconductor package 1300, rather than forming such solder balls 1360 on the second bond pads 1015' of the semiconductor package 1010', Referring now to FIG. 14, there is shown a semiconductor package 1400 constructed in accordance with a fourteenth embodiment of the present invention. The semiconductor package 1400 of the sixth embodiment is substantially identical to the semiconductor package 1000 shown and described above in relation to FIG. 10, with the sole exception lying in the substitution of the above-described solder layers 1020 used to electrically couple the semiconductor packages 1010, 1010' to each other with an inter-layer or interposer 1410. The interposer 1410 comprises an insulation layer 1412. Formed in the insulation layer 1412 are at least one, and preferably a plurality of conductive pads 1414. The conductive pads 1414 are formed in the insulation layer 1412 such that each of the conductive pads 1414 defines a generally planar first (top) surface 1417 which extends in generally co-planar relation to a generally planar first (top) surface 1413 of the insulation layer 1412, and an opposed, generally planar second (bottom) surface 1419 which extends in generally co-planar relation to a generally planar second (bottom) surface 1415 of the insulation layer 1412.

In the semiconductor package 1400, the first bond pads 1011 of the semiconductor package 1010 are electrically connected to respective ones of the conductive pads 1414 of the interposer 1410. Such electrical connection is preferably facilitated by interposing solder layers 1416a between corresponding pairs of the pads 1011, 1414, and more particularly between the first surfaces 1021 of the first bond pads 1011 and respective ones of the first surfaces 1417 of the conductive pads 1414. Similarly, the first bond pads 1011' of the semiconductor package 1010' are electrically connected to respective ones of the conductive pads 1414 of the interposer 1410. Such electrical connection is preferably facilitated by interposing solder layers 1416b between corresponding pairs of the pads 1011', 1414, and more particularly between the first surfaces 1021' of the first bond pads 1011' and respective ones of the second surfaces 1419 of the conductive pads 1414. Those of ordinary skill in the art will recognize that the solder layers 1416a, 1416b may be substituted with other materials such as gold, silver, nickel, palladium or other equivalent materials without departing from the spirit and scope of the present invention.

Figure 14:
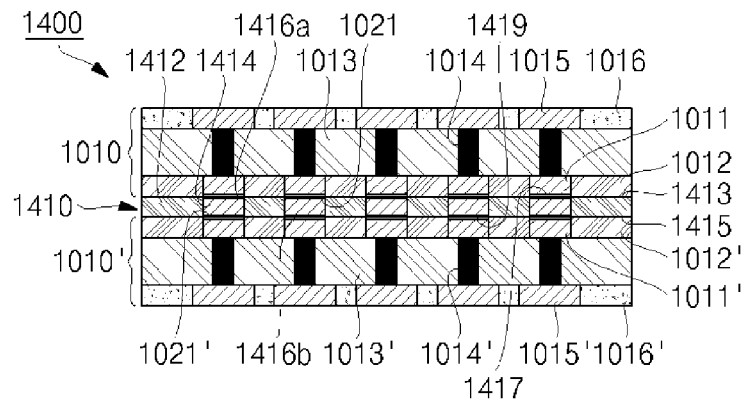
FIG. 14 is a cross-sectional view of a semiconductor package constructed in accordance with a fourteenth embodiment of the present invention.

In the semiconductor package 1400, the interposer 1410 is used to facilitate the I/O routing between the semiconductor packages 1010, 1010' in a prescribed pattern or arrangement. As shown in FIG. 14, each conductive pad 1414 of the interposer 1410 electrically couples a first bond pad 1011 of the semiconductor package 1010 to a first bond pad 1011' of the semiconductor package 1010' that is positioned opposite thereto and thus vertically aligned therewith. However, those of ordinary skill in the art will recognize that the interposer 1410 may be configured so as to electrically couple any first bond pad 1011 of the semiconductor package 1010 to a first bond pad 1011' of the semiconductor package 1010' that is not vertically aligned therewith. In this regard, wiring patterns may be formed on the first and second surfaces 1413, 1415 of the insulation layer 1412 of the interposer 1410 as needed to facilitate this alternative arrangement.

Figure 15:
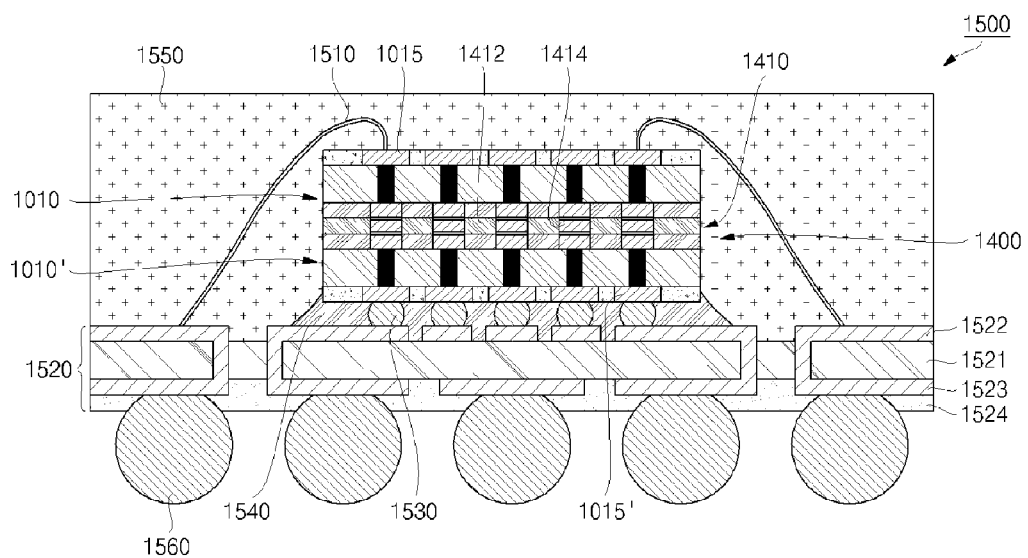
FIG. 15 is a cross-sectional view of a semiconductor package constructed in accordance with a fifteenth embodiment of the present invention.

Referring now to FIG. 15, there is shown a semiconductor package 1500 constructed in accordance with a fifteenth embodiment of the present invention. The semiconductor package 1500 of the fifteenth embodiment is substantially identical to the semiconductor package 1200 shown and described above in relation to FIG. 12, with the sole distinction lying in the substitution of the semiconductor package 1000 included in the semiconductor package 1200 with the semiconductor package 1400 shown and described above in relation to FIG. 14. Additionally, for purposes of clarity, the 1500 series reference numerals included in FIG. 15 are used to identify the same elements identified by respective ones of the corresponding 1200 series reference numerals included in FIG. 12.

Figure 16:
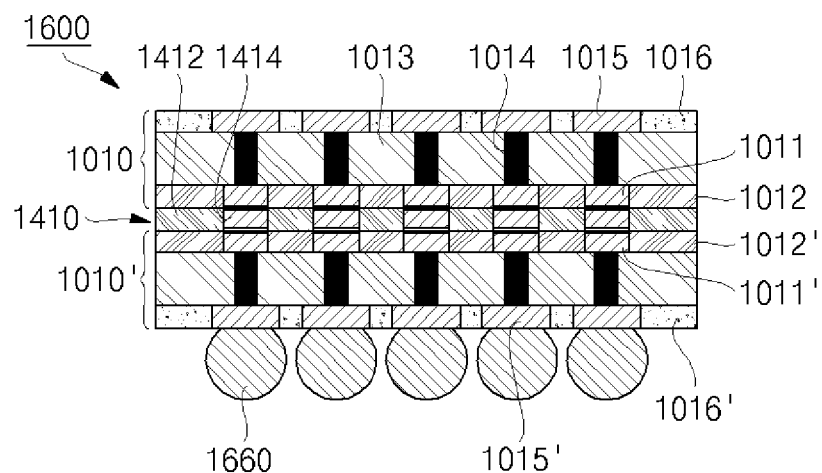
FIG. 16 is a cross-sectional view of a semiconductor package constructed in accordance with a sixteenth embodiment of the present invention.

Referring now to FIG. 16, there is shown a semiconductor package 1600 constructed in accordance with a sixteenth embodiment of the present invention. The semiconductor package 1600 is substantially identical to the semiconductor package 1400 described above in relation to FIG. 14, except that each of the second bond pads 1015' of the semiconductor package 1010' included in the semiconductor package 1600 includes a solder ball 1660 electrically coupled thereto. Though not shown in FIG. 16, those of ordinary skill in the art will further recognize that solder balls 1660 may be electrically coupled to respective ones of the second bond pads 1015 of the semiconductor package 1010 included in the semiconductor package 1600, rather than forming such solder balls 1660 on the second bond pads 1015' of the semiconductor package 1010'.

Figure 17A:
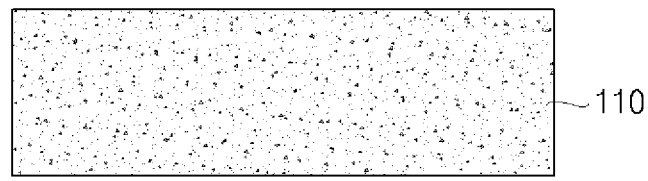
FIGS. 17a-17f illustrate an exemplary sequence of steps which may be used to facilitate the fabrication of the semiconductor package of the first embodiment shown in FIG. 1.

Referring now to FIG. 17a-17f, there is shown an exemplary sequence of steps which may be used to facilitate the fabrication of the semiconductor package 100 of the first embodiment shown in FIG. 1. In the initial step of the fabrication process shown in FIG. 17a, the bulk layer 110 is provided. The bulk layer 110 may comprise a silicon wafer or a silicon semiconductor that is doped or is not doped with group III or group V impurities. Though a single bulk layer 110 is shown in FIG. 17a, those of ordinary skill in the art will recognize that many bulk layers 110 numbering in the tens to thousands can be provided in an unsingulated state (thus being integrally connected to each other) for purposes of simultaneously producing a multiplicity of the semiconductor packages 100. In this respect, though the fabrication methodology as shown in relation to FIGS. 17a-17f is directed to a single semiconductor package 100, those of ordinary skill in the art will recognize that such fabrication methodology is also applicable to the simultaneous fabrication of a multiplicity of semiconductor packages 100.

Figure 17B:
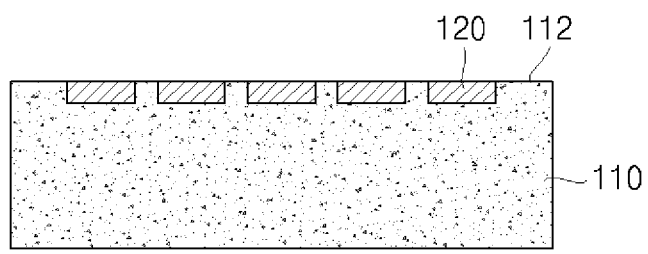

In the next step of the fabrication process shown in FIG. 17b, the first bond pads 120 are formed on the second surface 112 of the bulk layer 110. The first bond pads 120 may be formed on predetermined regions of the second surface 112 using photolithography techniques after forming a metal of a prescribed thickness on the second surface 112 through the use of, for example, a sputtering or plating process. The first bond pads 120 can also be formed in respective trenches disposed in the second surface 112 after forming such trenches through the use of an etching process.

Figure 17C:
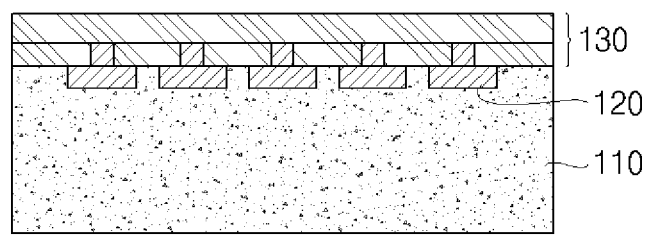

In the next step of the fabrication process shown in FIG. 17c, the active layer 130 is formed on the second surface 112 of the bulk layer 110 and electrically coupled to the first bond pads 120. The active layer 130 is preferably formed by a manufacturing process related to a semiconductor. For example, amorphous silicon, poly-crystalline silicon, or mono-crystalline silicon is formed on the second surface 112 of the bulk layer 110 and on the first bond pads 120, with an integrated circuit capable of performing an electrical function thereafter being formed by an ion injection process, a photolithography process, a metal process, an inter-layer process, a planarization process, a heat treatment process, a patterning process, a cleaning process, or the like. That is, an integrated circuit consisting of a large number of transistors, diodes, resistors, capacitors, wirings and the like can be formed in the active layer 130. As indicated above, the active layer 130 can be formed by one layer, or may alternatively be formed by at least the first and second active layers 131, 132 as shown in FIG. 17c and as described above in relation to FIG. 1.

Figure 17D:
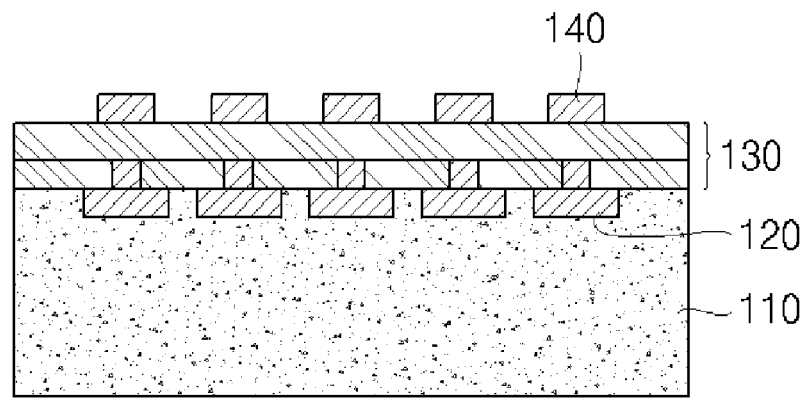

In the next step of the fabrication process shown in FIG. 17d, the second bond pads 140 are formed on and electrically coupled to the active layer 130. The second bond pads 140 may be formed on predetermined regions of the active layer 130 through the use of a photolithography technique after forming metal of a prescribed thickness on that surface of the active layer 130 opposite that applied to the bulk layer 110 through the use of, for example, a sputtering or plating process.

Figure 17E:
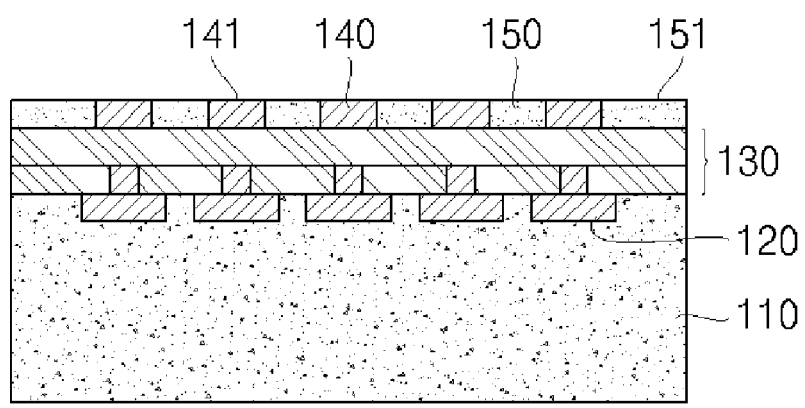

In the next step of the fabrication process shown in FIG. 17e, the protection layer 150 is formed on the active layer 130 so as to partially encapsulate the second bond pads 140. The protection layer 150 functions to protect the active layer 130 from the external environment. As indicated above, the protection layer 150 is preferably formed such that the first surface 141 of each of the second bond pads 140 is exposed in and extends in generally co-planar relation to the exposed, generally planar first surface 151 defined by the protection layer 150. The protection layer 150 may be formed by a typical screen printing process, a spin coating process, a spray process, a deposition process or the like. A photolithography process can be added if necessary.

Figure 17F:
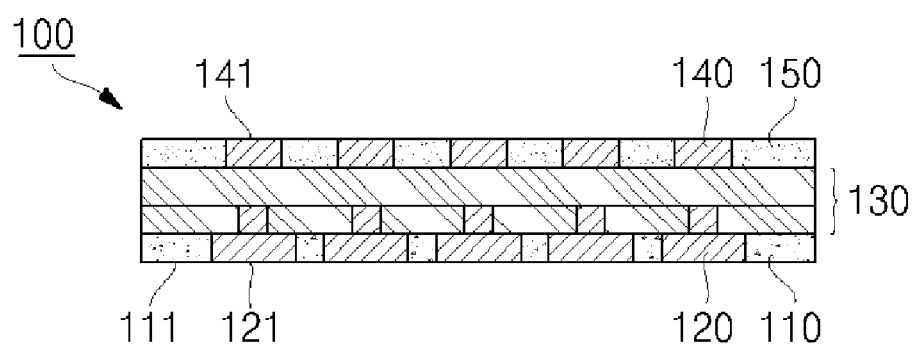

In the next step of the fabrication process shown in FIG. 17f, a back-grinding procedure is performed to complete the fabrication of the semiconductor package 100. More particularly, a lower portion of the bulk layer 110 is subjected to a back-grinding process as facilitates the formation of the first surface 111 thereof. As a result of the back grinding process, the first surface 121 defined by each of the first bond pads 120 is exposed in and substantially flush with the first surface 111 of the bulk layer 110 created as a result of the back-grinding process. Those of ordinary skill in the art will recognize that if the process described above in relation to the fabrication of a single semiconductor package 100 is completed in relation to the simultaneous fabrication of a multiplicity of semiconductor packages 100, a sawing or other singulation process may be implemented subsequent to the completion of the back-grinding process, such singulation occurring along scribe lines formed on a wafer in the form of cross lines. The completion of such singulation process effectively separates the individual semiconductor packages 100 from the wafer and thus from each other.

Figure 18A:
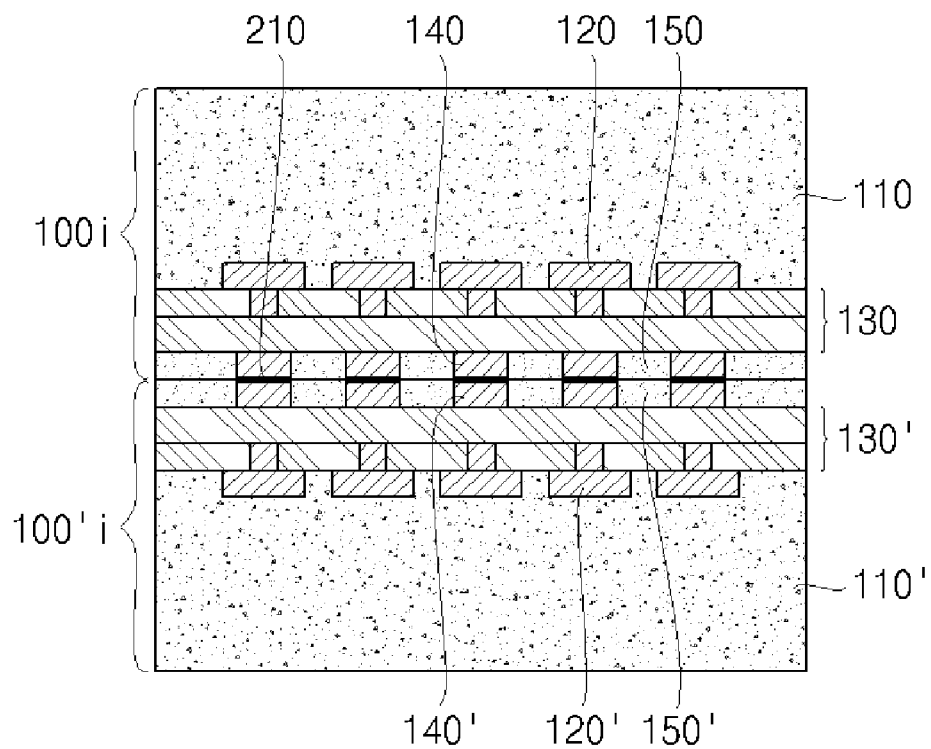
FIGS. 18a-18d illustrate an exemplary sequence of steps which may be used to facilitate the fabrication of the semiconductor package of the second embodiment shown in FIG. 2.
Figure 18B:
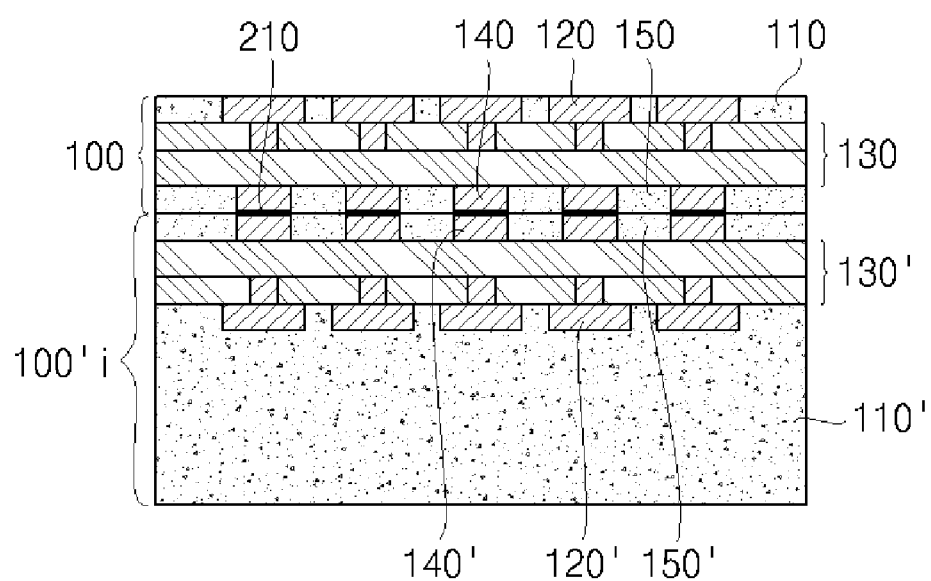

Referring now to FIGS. 18a-18b, there is shown an exemplary sequence of steps which may be used to facilitate the fabrication of the semiconductor package 200 shown in to FIG. 2. As shown in FIG. 18a, to facilitate the fabrication of the semiconductor package 200, each of the two individual semiconductor packages 100, 100' ultimately included in the semiconductor package 200 is partially fabricated through the completion of the steps highlighted above in relation to FIG. 17a-17e. In FIG. 18a, the partially fabricated semiconductor package 100 (i.e., fabricated through step FIG. 17e) is identified with the reference number 100i, with the partially fabricated semiconductor package 100' which is identical to the partially fabricated semiconductor package 100i being identified with the reference number 100'i. Thus, each of the partially fabricated semiconductor packages 100i, 100'i is identical to the partially fabricated semiconductor package shown in FIG. 17e since the back-grinding process described above in relation to FIG. 17f has not been performed on the bulk layers 110, 110' thereof. It should be noted that the reference numbers used in conjunction with the partially fabricated semiconductor package 100'i in FIG. 18a are identical to those used in relation to the partially fabricated semiconductor package 100i, but are accompanied by an apostrophe for purposes of differentiating the partially fabricated semiconductor packages 100i, 100'i from each other. However, as indicated above, such partially fabricated semiconductor packages 100i, 100'i are identically configured to each other, and are further identically configured to the partially fabricated semiconductor package shown in FIG. 17e.

As is further shown in FIG. 18a, the second bond pads 140 of the semiconductor package 100i are electrically connected to respective ones of the second bond pads 140' of the semiconductor package 100'i. More particularly, after interposing solder layers 210 between corresponding pairs of the bond pads 140, 140' in the manner described above in relation to FIG. 2, the partially fabricated semiconductor packages 100i, 100'i are positioned in a high temperature furnace and subjected to temperatures in the range of approximately 150° C. to 250° C. The exposure to these temperatures facilitates a reflow of the solder layers 210 as effectively electrically couples corresponding pairs of the second bond pads 140, 140' to each other.

Figure 18C:
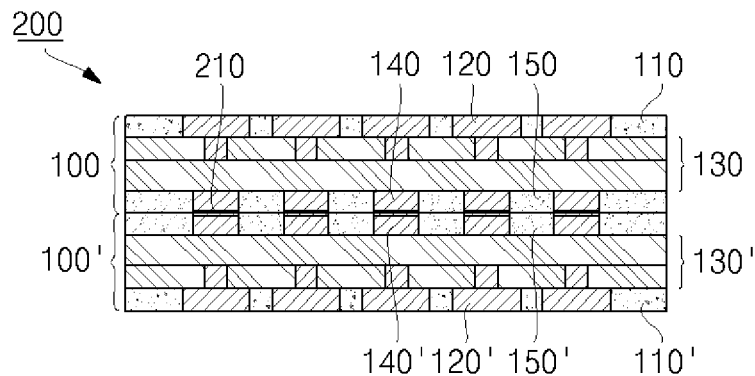
Figure 18D:
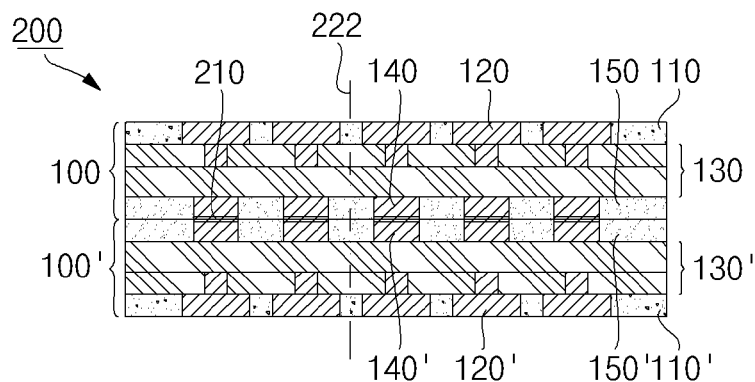

In the next step of the fabrication process shown in FIG. 18b, a back-grinding process is completed on the first partially fabricated semiconductor package 100i in the same manner described above in relation to FIG. 17f. The completion of this back-grinding process effectively facilitates the formation of the semiconductor package 100 of the semiconductor package 200. In the next step of the fabrication process shown in FIG. 18c, a back-grinding process is completed on the partially fabricated semiconductor package 100'i also in the same manner described above in relation to FIG. 17f. The completion of this back-grinding process effectively facilitates the formation of the semiconductor package 100' of the semiconductor package 200, such completed semiconductor packages 100, 100' already being electrically connected to each other through the completion of the reflow process described above in relation to FIG. 18b. As shown in FIG. 18d, the semiconductor package 200 may optionally be subjected to a singulation (e.g., a sawing) process wherein the passage of a saw blade along the scribe lines 222 shown in FIG. 18d may be used to effectively separate the semiconductor package 200 into smaller, stand alone semiconductor packages which are effectively separated from the wafer and from each other.

Figure 19:
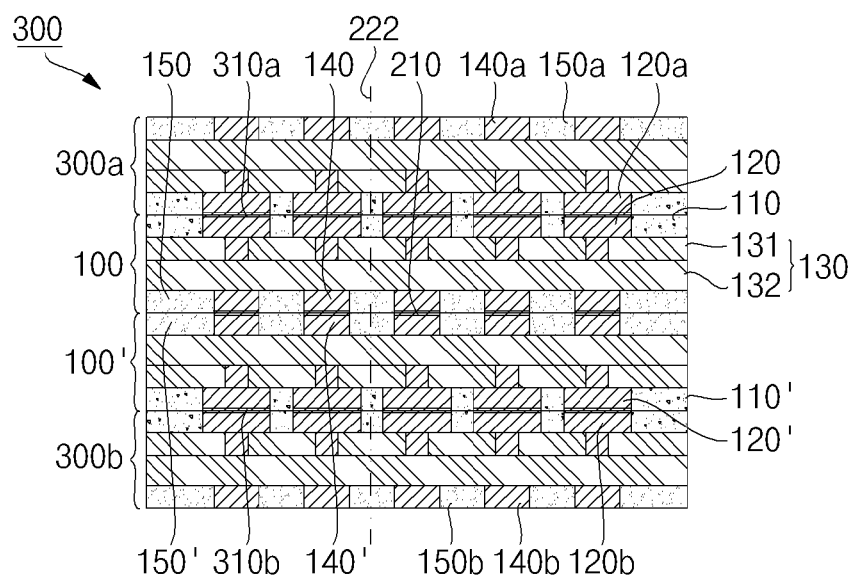
FIG. 19 illustrates an exemplary step which may be used in relation to the fabrication of the semiconductor package of the third embodiment shown in FIG. 3.

Referring now to FIG. 19, the singulation process described in relation to FIG. 18d may also be implemented in relation to the semiconductor package 300 of the third embodiment shown in FIG. 3. As shown in FIG. 19, the semiconductor package 300 may be subject to a singulation (e.g., a sawing) process wherein a saw blade is passed along the scribe lines 222 shown in FIG. 19. As a result of the completion of this sawing or other singulation process, the semiconductor package 300 may be separated into a plurality of smaller, stand alone semiconductor packages which are effectively separated from the wafer and from each other.

Figure 20A:
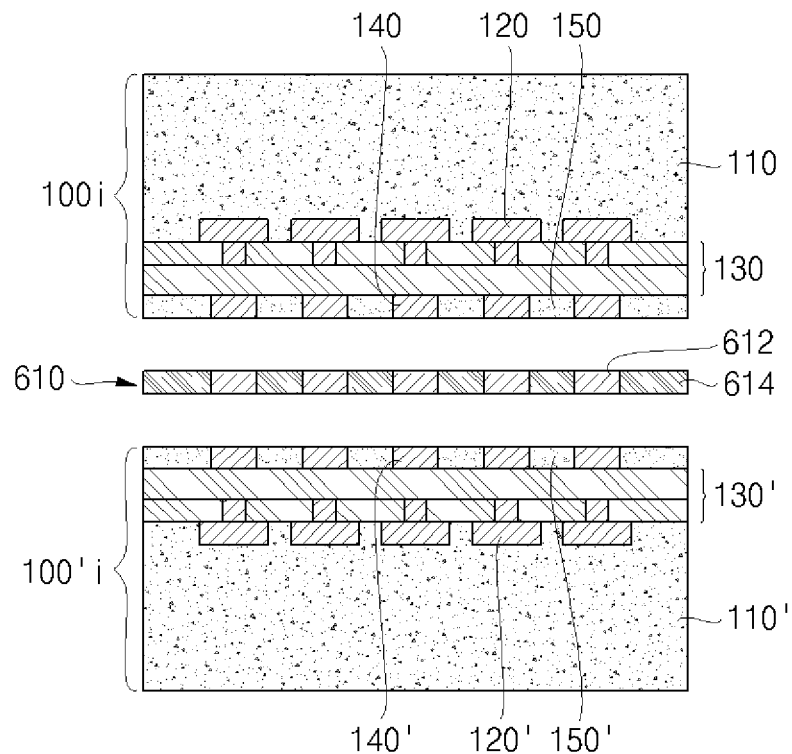
FIGS. 20a-20e illustrate an exemplary sequence of steps which may be used to facilitate the fabrication of the semiconductor package of the sixth embodiment shown in FIG. 6.

Referring now to FIGS. 20a-20e, there is depicted an exemplary sequence of steps which may be used to facilitate the fabrication of the semiconductor package 600 of the sixth embodiment shown in FIG. 6. As shown in FIG. 20a, to facilitate the fabrication of the semiconductor package 600, each of the two individual semiconductor packages 100, 100' ultimately included in the semiconductor package 600 is partially fabricated through the completion of the steps highlighted above in relation to FIGS. 17a-17e. In FIG. 20a, the partially fabricated semiconductor package 100 (i.e., fabricated through step FIG. 17e) is identified with the reference number 100i, with the partially fabricated semiconductor package 100' which is identical to the partially fabricated semiconductor package 100i being identified with the reference number 100'i. Thus, each of the partially fabricated semiconductor packages 100i, 100'i is identical to the partially fabricated semiconductor package shown in FIG. 17e since the back-grinding process described above in relation to FIG. 17f has not been performed on the bulk layers 110, 110' thereof. It should be noted that the reference numbers used in conjunction with the partially fabricated semiconductor package 100'i in FIG. 20a are identical to those used in relation to the partially fabricated semiconductor package 100i, but are accompanied by an apostrophe for purposes of differentiating the partially fabricated semiconductor packages 100i, 100'i from each other. However, as indicated above, such partially fabricated semiconductor packages 100i, 100'i are identically configured to each other, and are further identically configured to the partially fabricated semiconductor package shown in FIG. 17e. As is further shown in FIG. 20a, also provided in the initial step of the fabrication method for the semiconductor package 600 is the interposer 610 which has the structural attributes described above in relation to FIG. 6.

Figure 20B:
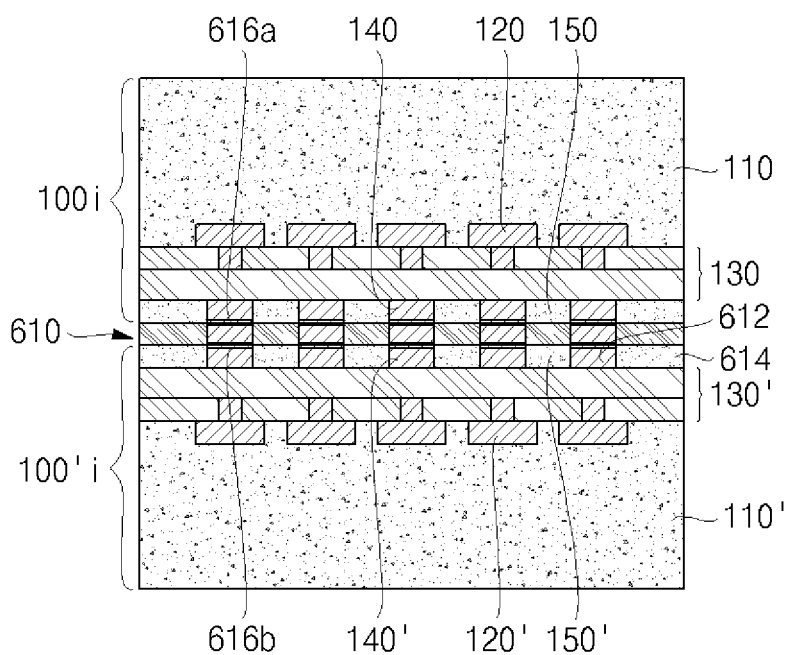

In the next step of the fabrication process shown in FIG. 20b, the second bond pads 140 of the semiconductor package 100i are electrically connected to respective ones of the conductive pads 614 of the interposer 610. Such electrical connection is preferably facilitated by interposing solder layers 616a between corresponding pairs of the pads 140, 614. Similarly, the second bond pads 140' of the semiconductor package 100'i are electrically connected to respective ones of the conductive pads 614 of the interposer 610. Such electrical connection is preferably facilitated by interposing solder layers 616b between corresponding pairs of the pads 140', 614.

More particularly, after interposing the solder layers 616a, 616b between respective, corresponding pairs of the pads 140, 140', 614 in the manner described above in relation to FIG. 6, the partially fabricated semiconductor packages 100i, 100'i are positioned in a high temperature furnace and subjected to temperatures in the range of approximately 150° C. to 250° C. The exposure to these temperatures facilitates a reflow of the solder layers 616a, 616b as effectively electrically couples corresponding pairs of the pads 140, 140', 614 to each other.

Figure 20C:
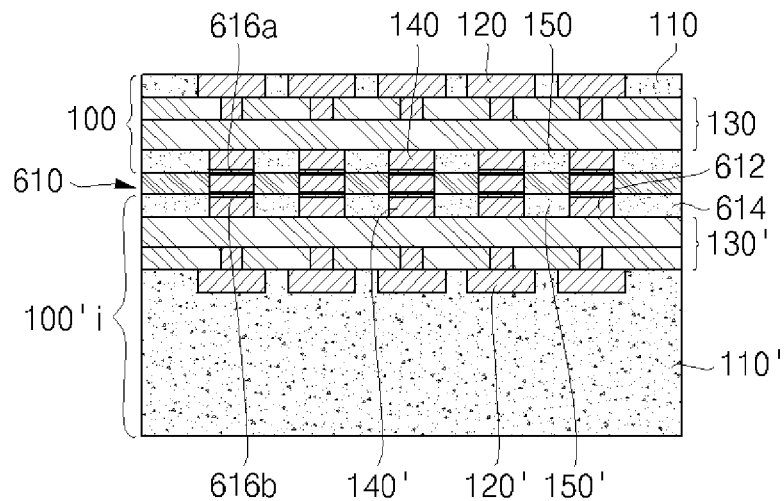
Figure 20D:
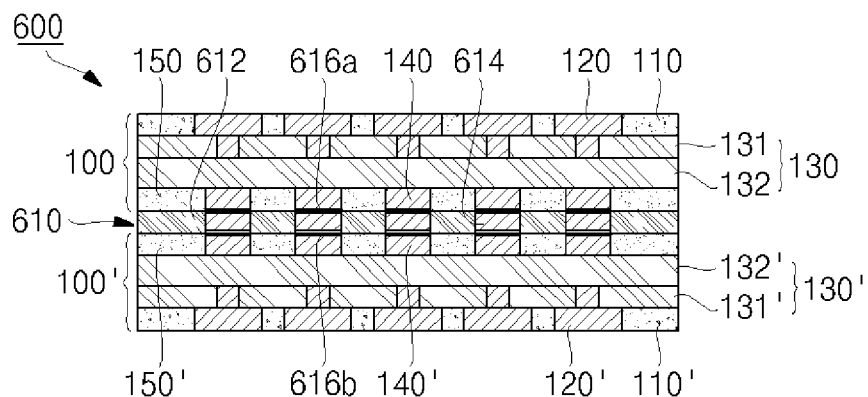
Figure 20E:
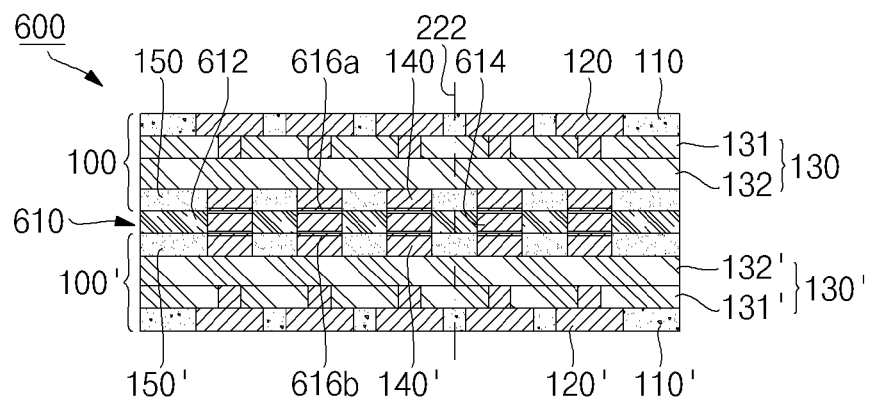

In the next step of the fabrication process shown in FIG. 20c, a back-grinding process is completed on the first partially fabricated semiconductor package 100i in the same manner described above in relation to FIG. 17f. The completion of this back-grinding process effectively facilitates the formation of the semiconductor package 100 of the semiconductor package 600. In the next step of the fabrication process shown in FIG. 20d, a back-grinding process is completed on the partially fabricated semiconductor package 100'i also in the same manner described above in relation to FIG. 17f. The completion of this back-grinding process effectively facilitates the formation of the semiconductor package 100' of the semiconductor package 600, such completed semiconductor packages 100, 100' already being electrically connected to each other through the completion of the reflow process described above in relation to FIG. 20b. As shown in FIG. 20e, the semiconductor package 600 may optionally be subjected to a singulation (e.g., a sawing) process wherein the passage of a saw blade along the scribe lines 222 shown in FIG. 20e may be used to effectively separate the semiconductor package 600 into smaller, stand alone semiconductor packages which are effectively separated from the wafer and from each other.

Figure 21:
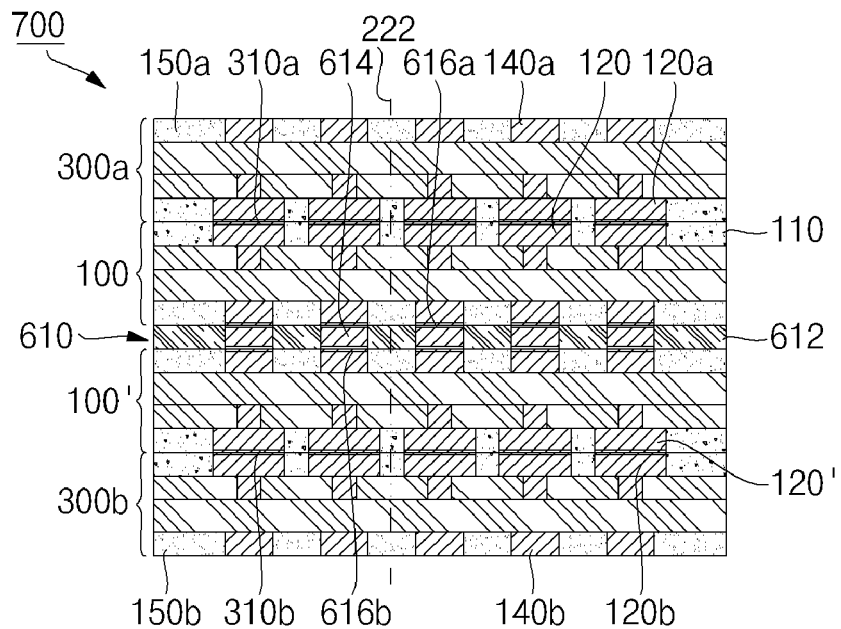
FIG. 21 illustrates an exemplary step which may be used in relation to the fabrication of the semiconductor package of the seventh embodiment shown in FIG. 7.

Referring now to FIG. 21, the singulation process described in relation to FIGS. 18d and 20e may also be implemented in relation to the semiconductor package 700 of the seventh embodiment shown in FIG. 7. As shown in FIG. 21, the semiconductor package 700 may be subject to a singulation (e.g., a sawing) process wherein a saw blade is passed along the scribe lines 222 shown in FIG. 21. As a result of the completion of this sawing or other singulation process, the semiconductor package 700 may be separated into a plurality of smaller, stand alone semiconductor packages which are effectively separated from the wafer and from each other.

Figure 22A:
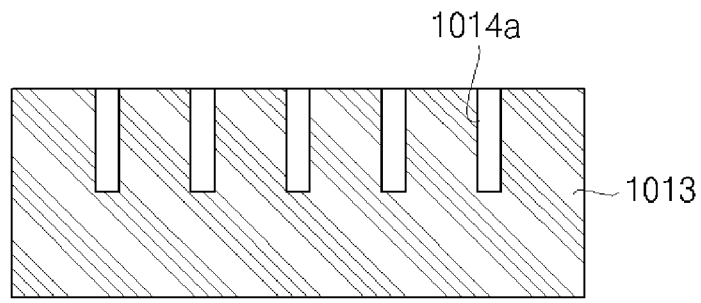
FIGS. 22a-22i illustrate an exemplary sequence of steps which may be used to facilitate the fabrication of the semiconductor package of the tenth embodiment shown in FIG. 10.

Referring now to FIG. 22a-22i, there is shown an exemplary sequence of steps which may be used to facilitate the fabrication of the semiconductor package 1000 of the tenth embodiment shown in FIG. 10. In the initial step of the fabrication process shown in FIG. 22a, the bulk layer 1013 is provided. The bulk layer 1013 may comprise a silicon wafer or a silicon semiconductor that is doped or is not doped with group III or group V impurities. Though a single bulk layer 1013 is shown in FIG. 22a, those of ordinary skill in the art will recognize that many bulk layers 1013 numbering in the tens to thousands can be provided in an unsingulated state (thus being integrally connected to each other) for purposes of simultaneously producing a multiplicity of the semiconductor packages 1000. In this respect, though the fabrication methodology as shown in relation to FIGS. 22a-22i is directed to a single semiconductor package 1000, those of ordinary skill in the art will recognize that such fabrication methodology is also applicable to the simultaneous fabrication of a multiplicity of semiconductor packages 1000. As further seen in FIG. 22a, the bulk layer 1013 is provided with a plurality of apertures or holes 1014a which will ultimately be used to create the above-described vias 1014. The holes 1014a are formed in a common surface of the bulk layer 1013, and extend partially through the bulk layer 1013. It is contemplated that the holes 1014*a* may be formed through the completion of an etching process or a laser process.

Figure 22B:
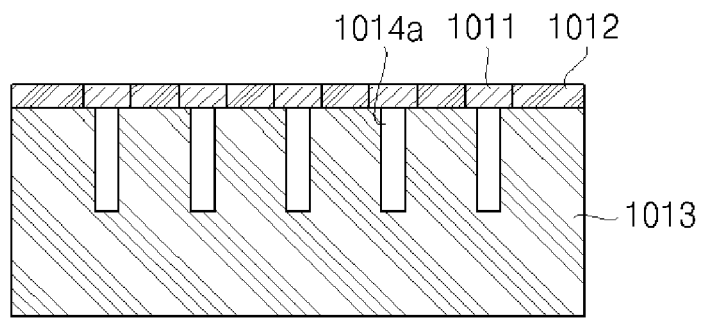

In the next step of the fabrication process shown in FIG. 22*b*, the first bond pads 1011 are formed on that surface of the bulk layer 1013 having the holes 1014*a* formed therein. In this regard, the first bond pads 1011 are arranged so as to be generally aligned with and cover respective ones of the holes 1014*a*. The first bond pads 1011 may be formed through the use of photolithography techniques after forming a metal of a prescribed thickness on the bulk layer 1013 through the use of, for example, a sputtering or plating process. The first bond pads 1011 can also be formed in respective trenches disposed in the bulk layer 1013 after forming such trenches through the use of an etching process. As further shown in FIG. 22*b*, the active layer 1012 is formed on that surface of the bulk layer 1013 having the first bond pads 1011 formed thereon. The active layer 1012 is further electrically coupled to the first bond pads 1011, and is oriented relative to the first bond pads 1011 in the manner described above with particularity in relation to FIG. 10. The active layer 1012 is preferably formed by a manufacturing process related to a semiconductor. For example, amorphous silicon, poly-crystalline silicon, or mono-crystalline silicon is formed on the bulk layer 1013 and on the first bond pads 1011, with an integrated circuit capable of performing an electrical function thereafter being formed by an ion injection process, a photolithography process, a metal process, an inter-layer process, a planarization process, a heat treatment process, a patterning process, a cleaning process, or the like. That is, an integrated circuit consisting of a large number of transistors, diodes, resistors, capacitors, wirings and the like can be formed in the active layer 1012.

Figure 22C:
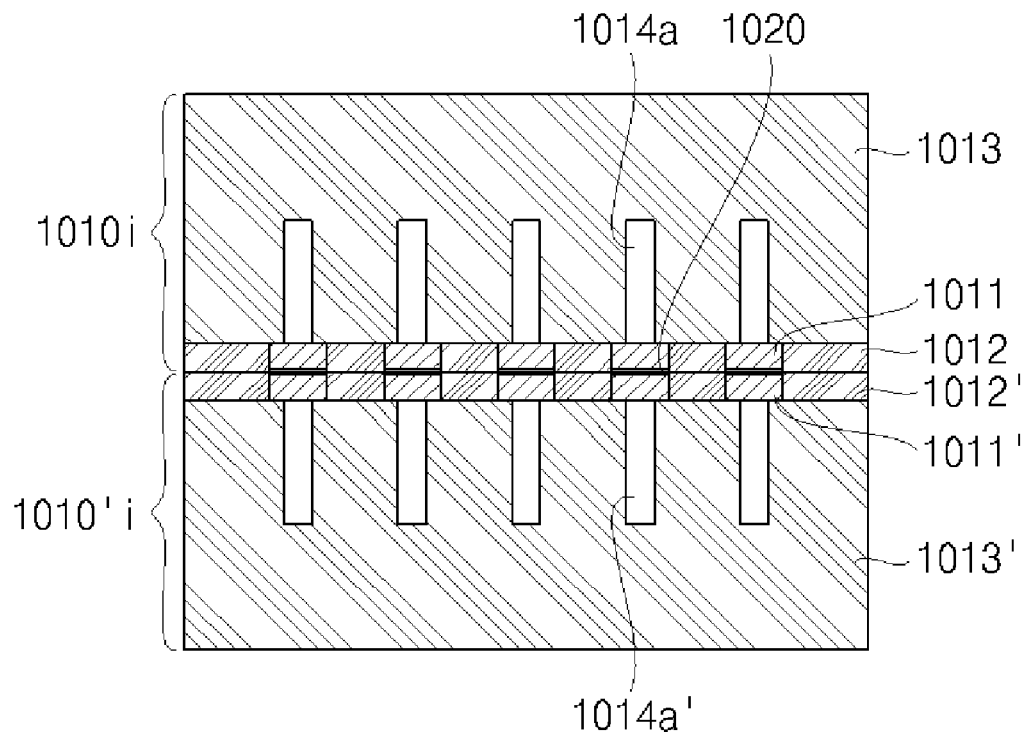

To facilitate the fabrication of the semiconductor package 1000, each of the two individual semiconductor packages 1010, 1010' ultimately included in the semiconductor package 1000 is partially fabricated through the completion of the steps highlighted above in relation to FIGS. 22*a* and 22*b* described above. In FIG. 22*c*, the partially fabricated semiconductor package 1010 (i.e., fabricated through step FIG. 22*b*) is identified with the reference number 1010*i*, with the partially fabricated semiconductor package 1010' which is identical to the partially fabricated semiconductor package 1010*i* being identified with the reference number 1010'*i*. Thus, each of the partially fabricated semiconductor packages 1010*i*, 1010'*i* is identical to the partially fabricated semiconductor package shown in FIG. 22*b*. It should be noted that the reference numbers used in conjunction with the partially fabricated semiconductor package 1010'*i* in FIG. 22*c* are identical to those used in relation to the partially fabricated semiconductor package 1010*i*, but are accompanied by an apostrophe for purposes of differentiating the partially fabricated semiconductor packages 1010*i*, 1010'*i* from each other. However, as indicated above, such partially fabricated semiconductor packages 1010*i*, 1010'*i* are identically configured to each other, and are further identically configured to the partially fabricated semiconductor package shown in FIG. 22*b*.

As is further shown in FIG. 22*c*, the first bond pads 1011 of the semiconductor package 1010*i* are electrically connected to respective ones of the first bond pads 1011' of the semiconductor package 1010'*i*. More particularly, after interposing solder layers 1020 between corresponding pairs of the bond pads 1011, 1011' in the manner described above in relation to FIG. 10, the partially fabricated semiconductor packages 1010*i*, 1010'*i* are positioned in a high temperature furnace and subjected to temperatures in the range of approximately 150° C. to 250° C. The exposure to these temperatures facilitates a reflow of the solder layers 1020 as effectively electrically couples corresponding pairs of the second bond pads 1011, 1011' to each other.

Figure 22D:
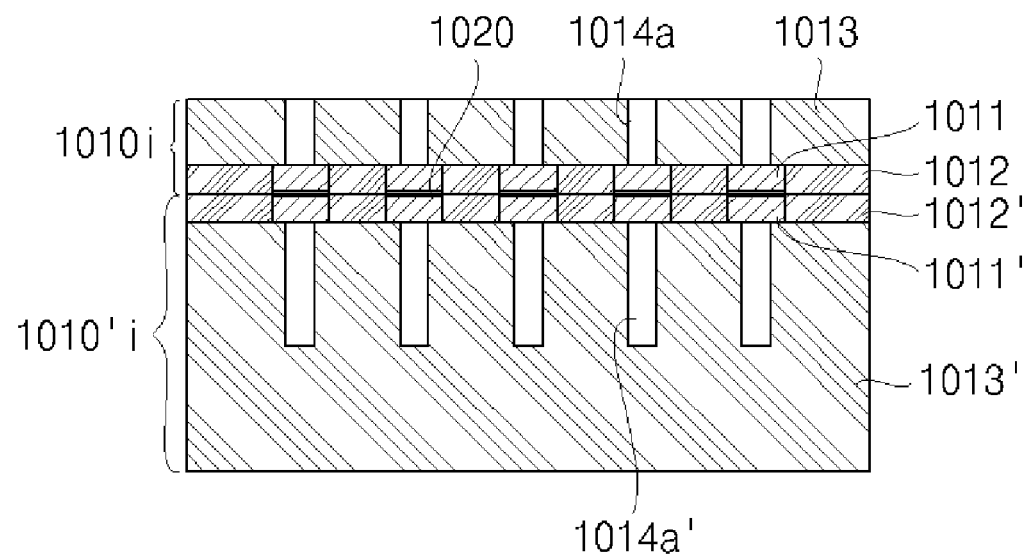

In the next step of the fabrication process shown in FIG. 22*d*, a back-grinding process is completed on the first partially fabricated semiconductor package 1010*i*. More particularly, that surface of the bulk layer 1013 opposite that having the first bond pads 1011 formed thereon is subjected to a back-grinding process as effectively reduces the thickness of the bulk layer 1013, and results in the holes 1014*a* being exposed in such opposed surface in the manner shown in FIG. 22*d*.

Figure 22E:
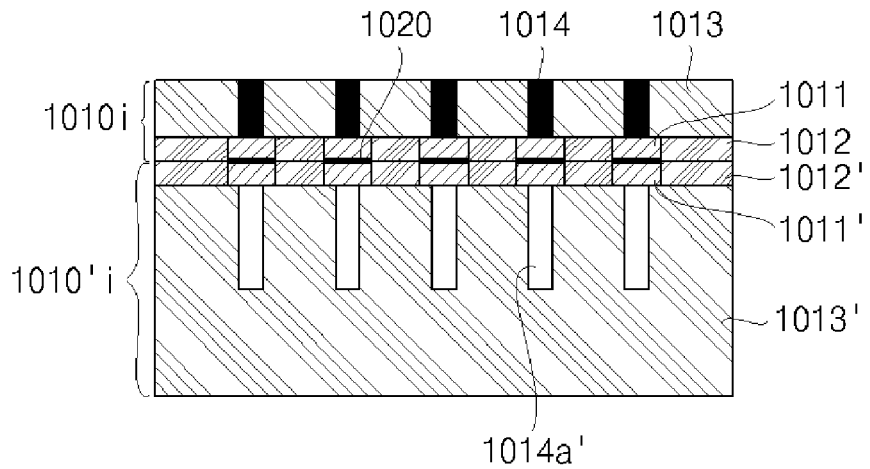

In the next step of the fabrication process shown in FIG. 22*e*, the holes 1014*a* of the first partially fabricated semiconductor package 1010*i* are filled with a conductive metal material to facilitate the formation of the vias 1014. Due to one of the open ends of each of the holes 1014*a* being effectively covered and enclosed by a respective one of the first bond pads 1011, each of the fully formed vias 1014 is electrically coupled to a respective one of the first bond pads 1011. The metal material used to form the vias 1014 may include solder, gold, silver, nickel, palladium or other equivalent materials, the present invention not being limited to any particular material for use in forming the vias 1014.

Figure 22F:
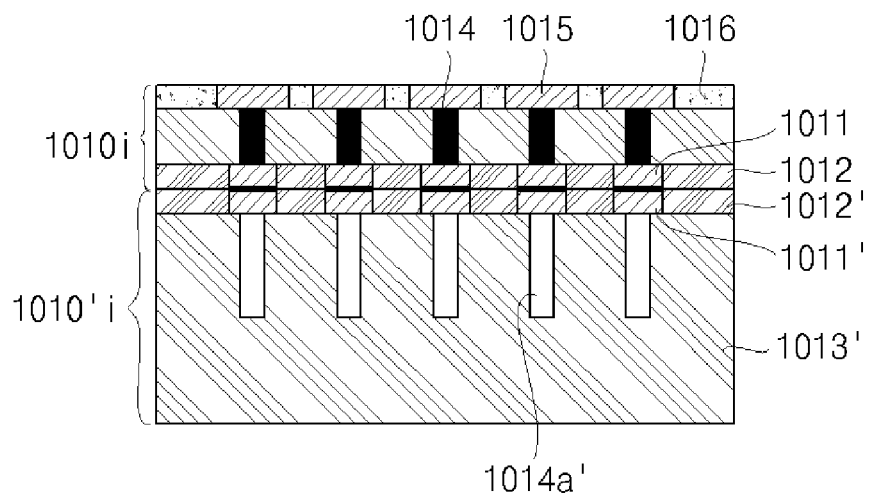

In the next step of the fabrication process shown in FIG. 22*f*, the second bond pads 1015 are formed on that surface of the bulk layer 1013 opposite that having the active layer 1012 applied thereto, each of the second bond pads 1015 being electrically coupled to a respective one of the vias 1014. Thereafter, the protection layer 1016 is applied to the same surface of the bulk layer 1013 so as to partially encapsulate the second bond pads 1015 in the manner shown in FIG. 22*f* and described above in relation to FIG. 10. The second bond pads 1015 may be formed on the bulk layer 1013 through the use of a photolithography technique after forming metal of a prescribed thickness on the bulk layer 1013 through the use of, for example, a sputtering or plating process. The protection layer 1016 may be formed by a typical screen printing process, a spin coating process, a spray process, a deposition process or the like. A photolithography process can be added if necessary. The completion of the step shown in FIG. 22*f* effectively facilitates the completion of the semiconductor package 1010 of the semiconductor package 1000.

Figure 22G:
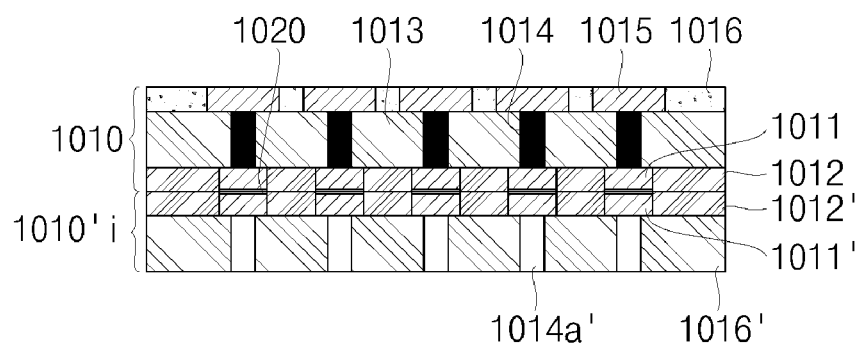

In the next step of the fabrication process shown in FIG. 22*g*, a back-grinding process is completed on the second partially fabricated semiconductor package 1010'*i*. More particularly, that surface of the bulk layer 1013' opposite that having the first bond pads 1011' formed thereon is subjected to a back-grinding process as effectively reduces the thickness of the bulk layer 1013', and results in the holes 1014*a*' being exposed in such opposed surface in the manner shown in FIG. 22*g*.

Figure 22H:
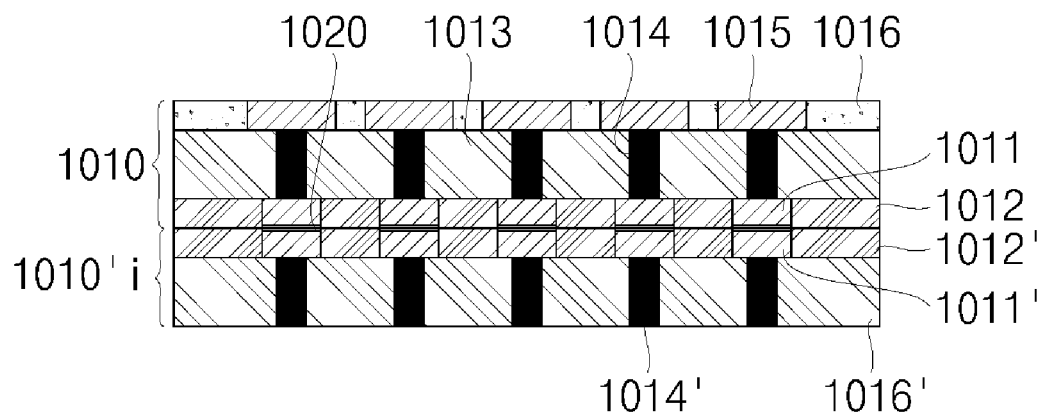

In the next step of the fabrication process shown in FIG. 22*h*, the holes 1014*a*' of the second partially fabricated semiconductor package 1010'*i* are filled with a conductive metal material to facilitate the formation of the vias 1014'. Due to one of the open ends of each of the holes 1014*a*' being effectively covered and enclosed by a respective one of the first bond pads 1011', each of the fully formed vias 1014' is electrically coupled to a respective one of the first bond pads 1011'. The metal material used to form the vias 1014' may include solder, gold, silver, nickel, palladium or other equivalent materials, the present invention not being limited to any particular material for use in forming the vias 1014'.

Figure 22I:
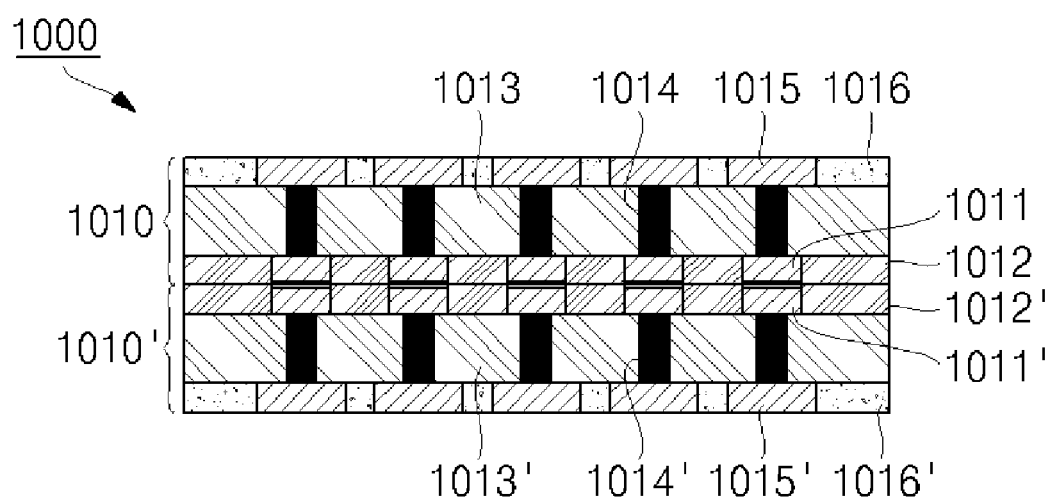

In the next step of the fabrication process shown in FIG. 22*i*, the second bond pads 1015' are formed on that surface of the bulk layer 1013' opposite that having the active layer 1012' applied thereto, each of the second bond pads 1015' being electrically coupled to a respective one of the vias 1014'. Thereafter, the protection layer 1016' is applied to the same surface of the bulk layer 1013' so as to partially encapsulate the second bond pads 1015' in the manner shown in FIG. 22*i* and described above in relation to FIG. 10. The second bond pads 1015' may be formed on the bulk layer 1013' through the use of a photolithography technique after forming metal of a prescribed thickness on the bulk layer 1013' through the use of, for example, a sputtering or plating process. The protection layer 1016' may be formed by a typical screen printing process, a spin coating process, a spray process, a deposition process or the like. A photolithography process can be added if necessary. The completion of the step shown in FIG. 22*f* effectively facilitates the completion of the semiconductor package 1010' of the semiconductor package 1000, and the semiconductor package 1000 as well.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
    a bulk layer defining opposed, generally planar first and second surfaces and a side surface, the bulk layer having at least one first bond pad formed therein, the first bond pad defining opposed, generally planar first and second surfaces with the first surface of the first bond pad being exposed in and extending in generally co-planar relation to the first surface of the bulk layer, and the second surface of the first bond pad extending in generally co-planar relation to the second surface of the bulk layer;
    at least one active layer defining a side surface, the active layer being formed on the bulk layer and electrically connected to the first bond pad;
    at least one second bond pad formed on the active layer and electrically connected thereto, the second bond pad defining a generally planar first surface and being separated from the first bond pad by the active layer; and
    a protection layer defining a side surface and generally planar first surface which extends in generally co-planar relation to the first surface of the second bond pad, the protection layer being formed on the active layer and at least partially encapsulating the second bond pad formed thereon;
    the side surfaces of the bulk layer, the active layer and the protection layer extending in generally co-planar relation to each other.

2. The semiconductor package of claim 1 wherein the semiconductor package comprises a plurality of first bond pads and a plurality of second bond pads which are each electrically connected to the active layer.

3. The semiconductor package of claim 1 wherein the active layer comprises first and second active layers disposed in side by side relation to each other.

4. A semiconductor package, comprising:
    at least first and second semiconductor packages, each of which comprises:
        a bulk layer having at least one first bond pad formed therein;
        at least one active layer formed on the bulk layer and electrically connected to the first bond pad;
        at least one second bond pad formed on the active layer and electrically connected thereto, the second bond pad being separated from the first bond pad by the active layer; and
        a protection layer formed on the active layer and at least partially encapsulating the second bond pad formed thereon;
    the second bond pad of the first semiconductor package being electrically connected to the second bond pad of the second semiconductor package.

5. The semiconductor package of claim 4 wherein the second bond pad of the first semiconductor package and the second bond pad of the second semiconductor package are electrically connected to each other by an intervening interposer.

6. The semiconductor package of claim 5 wherein the interposer comprises:
    an insulation layer; and
    at least one conductive pad disposed in the insulation layer, the conductive pad being electrically connected to the second bond pads of the first and second semiconductor packages.

7. The semiconductor package of claim 6 wherein:
    the first and second semiconductor packages each comprises a plurality of first bond pads and a plurality of second bond pads which are each electrically connected to the active layer thereof;
    the interposer comprises a plurality of conductive pads, each of the conductive pads being electrically connected to a corresponding pair of the second bond pads of the first and second semiconductor packages.

8. The semiconductor package of claim 7 wherein:
    the first and second semiconductor packages each comprises a plurality of first bond pads and a plurality of second bond pads which are each electrically connected to the active layer thereof;
    the second bond pads of the first semiconductor package are electrically connected to respective ones of the second bond pads of the second semiconductor package.

9. The semiconductor package of claim 8 wherein at least some of the first bond pads of the second semiconductor package have solder balls applied thereto.

10. A semiconductor package, comprising:
    a substrate comprising an insulation layer defining opposed first and second surfaces, a first conductive pattern disposed on the first surface, and a second conductive pattern disposed on the second surface and electrically connected to the first conductive pattern;
    at least one internal semiconductor package electrically connected to the first conductive pattern of the substrate and comprising:
        a bulk layer having at least one first bond pad formed therein;
        at least one active layer formed on the bulk layer and electrically connected to the first bond pad;
        at least one second bond pad formed on the active layer and electrically connected thereto, the second bond pad being separated from the first bond pad by the active layer; and
        a protection layer formed on the active layer and at least partially encapsulating the second bond pad formed thereon;
    a package body at least partially encapsulating the internal semiconductor package and the substrate such that the package body covers any exposed portions of the first conductive pattern and the first surface of the insulation layer, and does not cover the second conductive pattern.

11. The semiconductor package of claim 10 wherein the at least one internal semiconductor package comprises at least first and second semiconductor packages, each of which comprises:
- a bulk layer having at least one first bond pad formed therein;
- at least one active layer formed on the bulk layer and electrically connected to the first bond pad;
- at least one second bond pad formed on the active layer and electrically connected thereto; and
- a protection layer formed on the active layer and at least partially encapsulating the second bond pad formed thereon;
- the second bond pad of the first semiconductor package being electrically connected to the second bond pad of the second semiconductor package.

12. The semiconductor package of claim 11 wherein the first bond pad of the second semiconductor package is electrically connected to the first conductive pattern by a conductive bump.

13. The semiconductor package of claim 12 wherein the first bond pad of the first semiconductor package is electrically connected to the first conductive pattern by a conductive wire.

14. The semiconductor package of claim 13 wherein:
- the first and second semiconductor packages each comprises a plurality of first bond pads and a plurality of second bond pads which are each electrically connected to the active layer thereof;
- the second bond pads of the first semiconductor package are electrically connected to respective ones of the second bond pads of the second semiconductor package;
- the first bond pads of the second semiconductor package are electrically connected to the first conductive pattern by conductive bumps; and
- the first bond pads of the first semiconductor package are electrically connected to the first conductive pattern by conductive wires.

15. The semiconductor package of claim 11 wherein the second bond pad of the first semiconductor package and the second bond pad of the second semiconductor package are electrically connected to each other by an intervening interposer.

16. The semiconductor package of claim 15 wherein:
- the first and second semiconductor packages each comprises a plurality of first bond pads and a plurality of second bond pads which are each electrically connected to the active layer thereof; and
- the interposer comprises an insulation layer and a plurality of conductive pads disposed in the insulation layer, each of the conductive pads being electrically connected to a corresponding pair of the second bond pads of the first and second semiconductor packages.

17. A semiconductor package assembly, comprising:
a first semiconductor package, comprising:
- an active layer having a plurality of first bond pads arranged therein and electrically coupled thereto;
- a bulk layer formed on the active layer and including a plurality of conductive vias which are electrically connected to respective ones of the first bond pads;
- a plurality of second bond pads formed on the bulk layer and electrically connected to respective ones of the first bond pads; and
- a protection layer formed on the bulk layer and at least partially encapsulating the second bond pads formed thereon a second semiconductor package, comprising:
- an active layer having a plurality of first bond pads electrically coupled thereto;
- a bulk layer formed on the active layer and including a plurality of conductive vias which are electrically connected to respective ones of the first bond pads;
- a plurality of second bond pads formed on the bulk layer and electrically connected to respective ones of the first bond pads; and
- a protection layer formed on the bulk layer and at least partially encapsulating the second bond pads formed thereon;
- the first bond pads of the second semiconductor package being electrically connected to respective ones of the first bond pads of the first semiconductor package.

18. The semiconductor package of claim 17 further in combination with:
- a substrate having a conductive pattern disposed thereon, at least the second bond pads of the first semiconductor package being electrically connected to the conductive pattern; and
- a package body at least partially encapsulating the semiconductor package assembly and the substrate such that at least a portion of the conductive pattern of the substrate is not covered by the package body.

19. The semiconductor package of claim 18 wherein the second bond pads of the first semiconductor package and the second bond pads of the second semiconductor package are each electrically connected to the conductive pattern of the substrate.

20. The semiconductor package of claim 17 wherein the first bond pad of the semiconductor package and the first bond pad of the second semiconductor package are electrically connected to each other by an intervening interposer.

* * * * *